US010199240B2

(12) United States Patent
Hayashi et al.

(10) Patent No.: US 10,199,240 B2
(45) Date of Patent: Feb. 5, 2019

(54) SUBSTRATE PROCESSING METHOD, SUBSTRATE PROCESSING APPARATUS, AND STORAGE MEDIUM

(75) Inventors: Hidekazu Hayashi, Yokohama (JP); Yohei Sato, Yokohama (JP); Hisashi Okuchi, Yokohama (JP); Hiroshi Tomita, Yokohama (JP); Kazuyuki Mitsuoka, Nirasaki (JP); Mitsuaki Iwashita, Nirasaki (JP); Takehiko Orii, Nirasaki (JP); Gen You, Nirasaki (JP); Hiroki Ohno, Nirasaki (JP); Takayuki Toshima, Koshi (JP)

(73) Assignees: Toshiba Memory Corporation, Minato-Ku (JP); Tokyo Electron Limited, Minato-Ku (JP)

( * ) Notice: Subject to any disclaimer, the term of this patent is extended or adjusted under 35 U.S.C. 154(b) by 602 days.

(21) Appl. No.: 13/482,318

(22) Filed: May 29, 2012

(65) Prior Publication Data

US 2012/0304485 A1 Dec. 6, 2012

(30) Foreign Application Priority Data

May 30, 2011 (JP) .................................. 2011-120896
May 30, 2011 (JP) .................................. 2011-120905
(Continued)

(51) Int. Cl.
*H01L 21/67* (2006.01)
*H01L 21/02* (2006.01)
*B08B 7/00* (2006.01)

(52) U.S. Cl.
CPC ...... *H01L 21/67028* (2013.01); *B08B 7/0021* (2013.01); *H01L 21/02057* (2013.01); *H01L 21/02101* (2013.01)

(58) Field of Classification Search
CPC ......... H01L 21/02057; H01L 21/67028; H01L 21/02101; H01L 21/67034
See application file for complete search history.

(56) References Cited

U.S. PATENT DOCUMENTS

| 6,613,157 | B2 * | 9/2003 | DeYoung .............. B08B 7/0021 |
| | | | 134/2 |
| 2001/0013161 | A1 * | 8/2001 | Kitano et al. ................... 134/61 |

(Continued)

FOREIGN PATENT DOCUMENTS

| JP | 06-196472 A1 | 7/1994 |
| JP | 2001-176837 | 6/2001 |

(Continued)

OTHER PUBLICATIONS

International Search Report dated Aug. 14, 2012.

*Primary Examiner* — Jianying Atkisson
*Assistant Examiner* — Tavia Sullens
(74) *Attorney, Agent, or Firm* — Burr & Brown, PLLC

(57) ABSTRACT

A substrate processing method and apparatus which can remove an anti-drying liquid, which has entered a three-dimensional pattern with recessed portions formed in a substrate, in a relatively short time. The substrate processing method includes the steps of: carrying a substrate, having a three-dimensional pattern formed in a surface, into a processing container, said pattern being covered with an anti-drying liquid that has entered the recessed portions of the pattern; heating the substrate and supplying a pressurizing gas or a fluid in a high-pressure state into the processing container, thereby forming a high-pressure atmosphere in the processing container before the anti-drying liquid vaporizes to such an extent as to cause pattern collapse and bringing the anti-drying liquid into a high-pressure state while keeping the liquid in the recessed portions of the (Continued)

pattern; and thereafter discharging a fluid in a high-pressure state or a gaseous state from the processing container.

7 Claims, 19 Drawing Sheets

(30) Foreign Application Priority Data

| Feb. 9, 2012 | (JP) | 2012-026550 |
|---|---|---|
| Feb. 9, 2012 | (JP) | 2012-026564 |
| May 17, 2012 | (JP) | 2012-113556 |
| May 17, 2012 | (JP) | 2012-113563 |

(56) References Cited

U.S. PATENT DOCUMENTS

| 2004/0003828 A1* | 1/2004 | Jackson | 134/30 |
| 2007/0293054 A1* | 12/2007 | Lee | H01L 21/02101 438/743 |
| 2010/0071726 A1* | 3/2010 | Wagner et al. | 134/95.2 |
| 2010/0184301 A1* | 7/2010 | Wagner et al. | 257/E21.219 |
| 2011/0000507 A1 | 1/2011 | Toshima et al. | |
| 2011/0000512 A1 | 1/2011 | Toshima et al. | |
| 2011/0220152 A1 | 9/2011 | Kitajima et al. | |
| 2011/0289793 A1* | 12/2011 | Hayashi | F26B 3/04 34/357 |
| 2012/0118332 A1* | 5/2012 | Sato | H01L 21/67034 134/30 |
| 2012/0240426 A1* | 9/2012 | Hayashi | H01L 21/02101 34/351 |

FOREIGN PATENT DOCUMENTS

| JP | 2004-327894 | | 11/2004 |
| JP | 2004-335988 | | 11/2004 |
| JP | 2005-101074 | A1 | 4/2005 |
| JP | 2006-040969 | A1 | 2/2006 |
| JP | 2010-161165 | A1 | 7/2010 |
| JP | 2011-014706 | A1 | 1/2011 |
| JP | 2011-192835 | | 9/2011 |
| JP | 2011-249454 | | 12/2011 |
| WO | 2010/036575 | A2 | 4/2010 |

* cited by examiner

SUBSTRATE PROCESSING METHOD, SUBSTRATE PROCESSING APPARATUS, AND STORAGE MEDIUM

TECHNICAL FIELD

The present invention relates to a technique for removing a liquid from a substrate surface by using a fluid in a supercritical state or a subcritical state.

BACKGROUND ART

In a semiconductor device manufacturing process for forming a laminated integrated circuit structure in a surface of a semiconductor wafer (hereinafter simply referred to as "wafer") as a substrate, there is provided a liquid processing step for carrying out processing of a wafer surface, such as removal of small foreign matter or a natural oxide film from the wafer surface, e.g. by using a cleaning liquid such as a liquid chemical.

As semiconductor devices are becoming more highly integrated, a phenomenon called pattern collapse, which can occur when removing a liquid which has adhered to a wafer surface in such a liquid processing step, is becoming a serious problem. Pattern collapse is a phenomenon in which a liquid, remaining on both sides of a raised portion (i.e. remaining in recessed portions) of a three-dimensional pattern, is unevenly dried upon drying of the liquid remaining on the wafer surface whereby a surface tension, acting sideways on the raised portion, becomes unbalanced and the raised portion falls to the side where a larger amount of the liquid remains.

A method using a fluid in a supercritical state or a subcritical state (hereinafter collectively referred to as a "high-pressure state") is known as a method to remove a liquid from a wafer surface while preventing the occurrence of pattern collapse. A fluid in a high-pressure state (high-pressure fluid) has a lower viscosity than a liquid and has a high ability to extract a liquid. In addition, no interface exists between a high-pressure fluid and a liquid or a gas in equilibrium with the fluid. Therefore, a liquid adhering to a wafer surface can be removed, without being influenced by the surface tension, by replacing the liquid on the wafer surface with a high-pressure fluid, and then changing the high-pressure fluid into a gas.

Through studies for the development of a technique for removing a liquid from a wafer surface by using a high-pressure fluid, the present inventors have come to be aware of the fact that it is sometimes difficult to remove a liquid from recessed portions of a three-dimensional pattern having a high aspect ratio. In such a case, it takes a long time to perform a process comprising extracting and replacing a liquid in recessed portions of a pattern with a high-pressure fluid. This is a serious problem in achieving the practical use of the liquid removal technique using a high-pressure fluid.

Patent document 1 describes a technique for removing a rinsing liquid from a substrate by immersing the substrate in a supercritical substance which enters a supercritical state under certain conditions, and bringing the mixture of the rinsing liquid and the supercritical substance into a co-critical state in which the rinsing liquid and the supercritical substance are both in a supercritical state. However, it has been found by our experiments that the pattern collapse phenomenon can occur at a temperature around a co-critical temperature which is lower than the critical temperature of a rinsing liquid. Thus, it has turned out that in order to remove a rinsing liquid in a supercritical state from a wafer surface, the processing needs to be carried out at a temperature which is not less than the critical temperature of the rinsing liquid. FIG. 14 shows the number of particles on a wafer as observed when a rinsing liquid on the wafer is mixed with liquid $CO_2$, supercritical $CO_2$ or gaseous $CO_2$. It has been found by our experiments that a larger number of particles adhere to a wafer surface when a supercritical substance, e.g. supercritical $CO_2$, is used and mixed with a rinsing liquid as compared to the use of gaseous $CO_2$. This is because of transportation of particles by a high-density supercritical substance. It is preferred from this viewpoint that a substance to be mixed with a rinsing liquid be in a gaseous state. Pattern collapse can be prevented and the number of particles can be reduced if the processing pressure is not less than a pressure at which the rinsing liquid enters the supercritical state. It is difficult for this technique to remove a rinsing liquid, which has entered the recessed portions of a three-dimensional pattern having a high aspect ratio, in a supercritical state in a short time. A demand therefore exists to remove a rinsing liquid from the recessed portions of a three-dimensional pattern in a shorter time in order to achieve high productivity.

Prior Art Document

Patent document 1: Japanese Patent Laid-Open Publication No. 2005-101074, claims 1, 3, paragraphs 0024-0027 and FIGS. 1, 3

SUMMARY OF THE INVENTION

Problems to be Solved by the Invention

The present invention has been made in view of the above situation. It is therefore an object of the present invention to provide a substrate processing method and a substrate processing apparatus which can remove an anti-drying liquid, which has entered a three-dimensional pattern formed in a substrate, in a short time, and to provide a storage medium storing a program for performing the substrate processing method.

Means for Solving the Problems

The present invention provides a substrate processing method comprising the steps of: carrying a substrate, having a three-dimensional pattern formed in a surface, into a processing container, said pattern with recessed portions being covered with an anti-drying liquid that has entered the recessed portions of the pattern; heating the substrate and supplying a pressurizing gas or a fluid in a high-pressure state into the processing container, thereby forming a high-pressure atmosphere in the processing container before the anti-drying liquid vaporizes to such an extent as to cause pattern collapse and bringing the anti-drying liquid into a high-pressure state while keeping the liquid in the recessed portions of the pattern; and thereafter discharging a fluid in a high-pressure state or a gaseous state from the processing container.

In a preferred embodiment of the present invention, in the step of carrying the substrate into the processing container, the substrate is carried into the processing container which has been preheated.

The preheating temperature of the processing container may be not less than the critical temperature of the anti-drying liquid.

In a preferred embodiment of the present invention, the pressurizing gas or the fluid in a high-pressure state is pressurized to a pressure not less than the critical pressure of the anti-drying liquid before the gas or the fluid is supplied into the processing container.

In a preferred embodiment of the present invention, the pressurizing fluid is in a gaseous state when it is pressurized to a pressure not less than the critical pressure of the anti-drying liquid and when the anti-drying liquid becomes a supercritical state.

In a preferred embodiment of the present invention, the pressurizing fluid is in a high-pressure state (supercritical state or subcritical state) when it is pressurized to a pressure not less than the critical pressure of the anti-drying liquid and when the anti-drying liquid becomes a supercritical state.

In a preferred embodiment of the present invention, the substrate is covered with the anti-drying liquid when the substrate is carried into the processing container.

In a preferred embodiment of the present invention, the anti-drying liquid is either combustible or incombustible, and the method further comprises the step of supplying an inert gas into the processing container prior to the step of carrying the substrate into the processing container.

The present invention also provides a substrate processing apparatus comprising: a processing container for performing removal of an anti-drying liquid from a substrate having a three-dimensional pattern with recessed portions formed in a surface, said pattern being covered with the anti-drying liquid that has entered the recessed portions of the pattern; a transfer section for carrying the substrate into and out of the processing container; a heating section for heating the substrate which has been carried into the processing container; a pressurized fluid supply line for supplying a pressurizing gas or a fluid in a high-pressure state into the processing container; a discharge line for discharging a fluid from the processing container; and a control section for outputting a control signal to control the transfer section, the heating section, the pressurized fluid supply line and the discharge line so that they perform a method comprising the steps of: carrying the substrate, with the anti-drying liquid attached thereto, into the processing container; heating the substrate and supplying the pressurizing gas or the fluid in a high-pressure state into the processing container, thereby forming a high-pressure atmosphere in the processing container before the anti-drying liquid vaporizes to such an extent as to cause pattern collapse and bringing the anti-drying liquid into a high-pressure state while keeping the liquid in the recessed portions of the pattern; and thereafter discharging the fluid in a high-pressure state or a gaseous state from the processing container.

In a preferred embodiment of the present invention, the heating section heats the substrate by heating the internal atmosphere of the processing container; and the substrate is carried into the processing container which has been preheated.

The preheating temperature of the processing container may be not less than the critical temperature of the anti-drying liquid.

In a preferred embodiment of the present invention, the pressurizing gas or the fluid in a high-pressure state is pressurized to a pressure not less than the critical pressure of the anti-drying liquid before the gas or the fluid is supplied into the processing container.

In a preferred embodiment of the present invention, the pressurizing fluid is in a gaseous state when it is pressurized to a pressure not less than the critical pressure of the anti-drying liquid and when the anti-drying liquid becomes a supercritical state.

In a preferred embodiment of the present invention, the pressurizing fluid is in a high-pressure state (supercritical state or subcritical state) when it is pressurized to a pressure not less than the critical pressure of the anti-drying liquid and when the anti-drying liquid becomes a supercritical state.

In a preferred embodiment of the present invention, the substrate is covered with the anti-drying liquid when the substrate is carried into the processing container.

In a preferred embodiment of the present invention, the anti-drying liquid is either combustible or incombustible, and the method further comprises the step of supplying an inert gas into the processing container prior to the step of carrying the substrate into the processing container.

The present invention also provides a storage medium storing a computer program for use in a substrate processing apparatus for performing removal of an anti-drying liquid from a substrate having a three-dimensional pattern with recessed portions formed in a surface, said pattern being covered with the anti-drying liquid that has entered the recessed portions of the pattern, wherein said program contains steps to perform the above-described substrate processing method.

The present invention also provides a substrate processing method comprising the steps of: carrying a substrate, having a three-dimensional pattern with recessed portions formed in a surface, into a processing container, said pattern being covered with an anti-drying liquid that has entered the recessed portions of the pattern; heating the substrate while pressurizing the interior of the processing container so that the temperature-pressure state of the anti-drying liquid on the substrate changes along the vapor pressure curve of the anti-drying liquid or along a curve lying on the liquid phase side of the vapor pressure curve, and reaches a high-pressure state which is a supercritical state or a subcritical state, thereby bringing the anti-drying liquid into the high-pressure state while keeping the liquid in the recessed portions of the pattern; and thereafter discharging a fluid in a high-pressure state or a gaseous state from the processing container.

In a preferred embodiment of the present invention, the pressurization of the interior of the processing container is carried out by supplying a pressurizing gas or a fluid in a high-pressure state into the processing container.

In a preferred embodiment of the present invention, the pressurizing fluid is in a gaseous state when it is pressurized to a pressure not less than the critical pressure of the anti-drying liquid and when the anti-drying liquid becomes a supercritical state.

In a preferred embodiment of the present invention, the pressurizing fluid is in a high-pressure state (supercritical state or subcritical state) when it is pressurized to a pressure not less than the critical pressure of the anti-drying liquid and when the anti-drying liquid becomes a supercritical state.

In a preferred embodiment of the present invention, the substrate is immersed in the anti-drying liquid when the substrate is heated in the processing container.

In a preferred embodiment of the present invention, the substrate is covered with the anti-drying liquid when the substrate is carried into the processing container.

In a preferred embodiment of the present invention, the anti-drying liquid is either combustible or incombustible, and the method further comprises the step of supplying an inert gas into the processing container prior to the step of carrying the substrate into the processing container.

The present invention also provides a substrate processing apparatus comprising: a processing container for performing removal of an anti-drying liquid from a substrate having a three-dimensional pattern with recessed portions formed in a surface, said pattern being covered with the anti-drying liquid that has entered the recessed portions of the pattern; a transfer section for carrying the substrate into and out of the processing container; a pressurizing section for pressurizing the interior of the processing container; a heating section for heating the substrate in the processing container; a discharge line for discharging a fluid from the processing container; and a control section for outputting a control signal to control the transfer section, the pressurizing section, the heating section and the discharge line so that they perform a method comprising the steps of: carrying the substrate, with the anti-drying liquid attached thereto, into the processing container; heating the substrate while pressurizing the interior of the processing container so that the temperature-pressure state of the anti-drying liquid on the substrate changes along the vapor pressure curve of the anti-drying liquid or along a curve lying on the liquid phase side of the vapor pressure curve, and reaches a high-pressure state which is a supercritical state or a subcritical state, thereby bringing the anti-drying liquid into the high-pressure state while keeping the liquid in the recessed portions of the pattern; and thereafter discharging the fluid in a high-pressure state or a gaseous state from the processing container.

In a preferred embodiment of the present invention, the pressurizing section pressurizes the interior of the processing container by supplying a pressurizing gas or a fluid in a high-pressure state into the processing container.

In a preferred embodiment of the present invention, the pressurizing fluid is in a gaseous state when it is pressurized to a pressure not less than the critical pressure of the anti-drying liquid and when the anti-drying liquid becomes a supercritical state.

In a preferred embodiment of the present invention, the pressurizing fluid is in a high-pressure state (supercritical state or subcritical state) when it is pressurized to a pressure not less than the critical pressure of the anti-drying liquid and when the anti-drying liquid becomes a supercritical state.

In a preferred embodiment of the present invention, the substrate is immersed in the anti-drying liquid when the substrate is heated in the processing container.

In a preferred embodiment of the present invention, the substrate is covered with the anti-drying liquid when the substrate is carried into the processing container.

In a preferred embodiment of the present invention, the anti-drying liquid is either combustible or incombustible, and the method further comprises the step of supplying an inert gas into the processing container prior to the step of carrying the substrate into the processing container.

The present invention also provides a storage medium storing a computer program for use in a substrate processing apparatus for performing removal of an anti-drying liquid from a substrate having a three-dimensional pattern with recessed portions formed in a surface, said pattern being covered with the anti-drying liquid that has the entered the recessed portions of the pattern, wherein said program contains steps to perform the above-described substrate processing method.

Advantageous Effects of the Invention

According to the present invention, a substrate with an anti-drying liquid attached is heated while forming a high-pressure atmosphere in a processing container by supplying a pressurizing gas or a fluid in a high-pressure state (a supercritical state or a subcritical state) into the processing container, whereby the anti-drying liquid is changed into a fluid in a high-pressure state while keeping the fluid in recessed portions of a three-dimensional pattern formed in the substrate. This method makes it possible to remove the liquid from the substrate in a relatively short time while preventing the occurrence of pattern collapse.

According to the present invention, a substrate with an anti-drying liquid attached is heated while pressurizing the interior of a processing container so that the temperature-pressure state of the internal atmosphere of the processing container changes along the vapor pressure curve of the anti-drying liquid or along a curve lying on the liquid phase side of the vapor pressure curve, and reaches a high-pressure state which is a supercritical state or a subcritical state. This method can change the anti-drying liquid into a fluid in a high-pressure state while avoiding boiling of the liquid and while keeping the fluid in recessed portions of a three-dimensional pattern formed in the substrate, making it possible to remove the liquid from the substrate while preventing the occurrence of pattern collapse.

DETAILED DESCRIPTION OF THE INVENTION

First Embodiment

A first embodiment of the present invention will now be described with reference to FIGS. 1 through 14.

A cleaning system 1, which is an exemplary substrate processing system provided with a substrate processing apparatus according to the present invention, includes a cleaning apparatus 2 for supplying a cleaning liquid to a wafer W, a substrate to be processed, to perform cleaning of the wafer W, and a supercritical processing apparatus 3 for removing an anti-drying liquid from the wafer W after cleaning by bringing the liquid into the supercritical state (high-pressure state).

Figure 1:
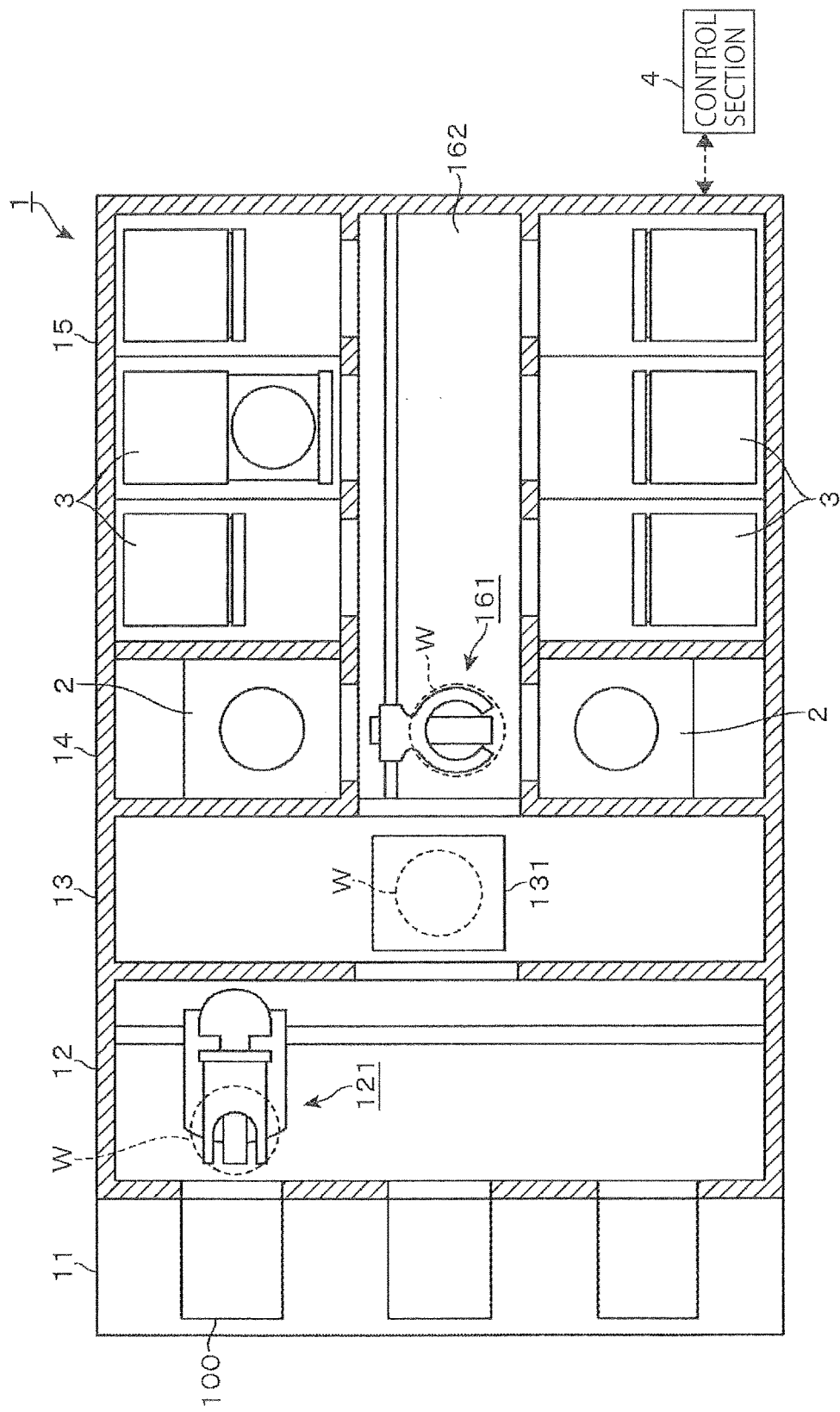
FIG. 1 is a cross-sectional plan view of a cleaning system according to a first embodiment of the present invention.
Figure 2:
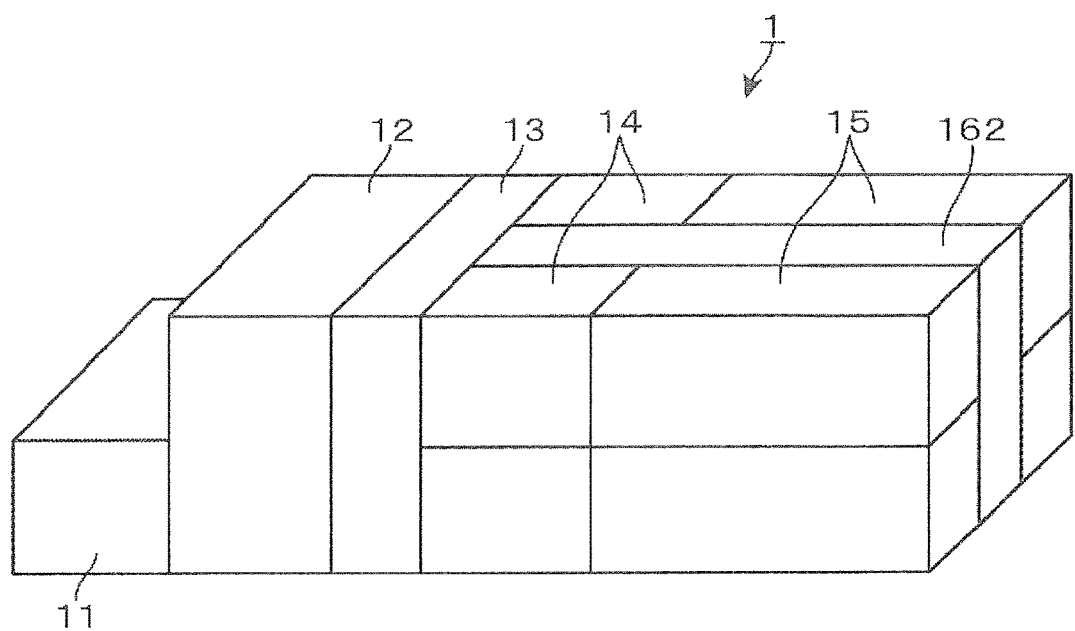
FIG. 2 is an external perspective view of the cleaning system.
Figure 3:
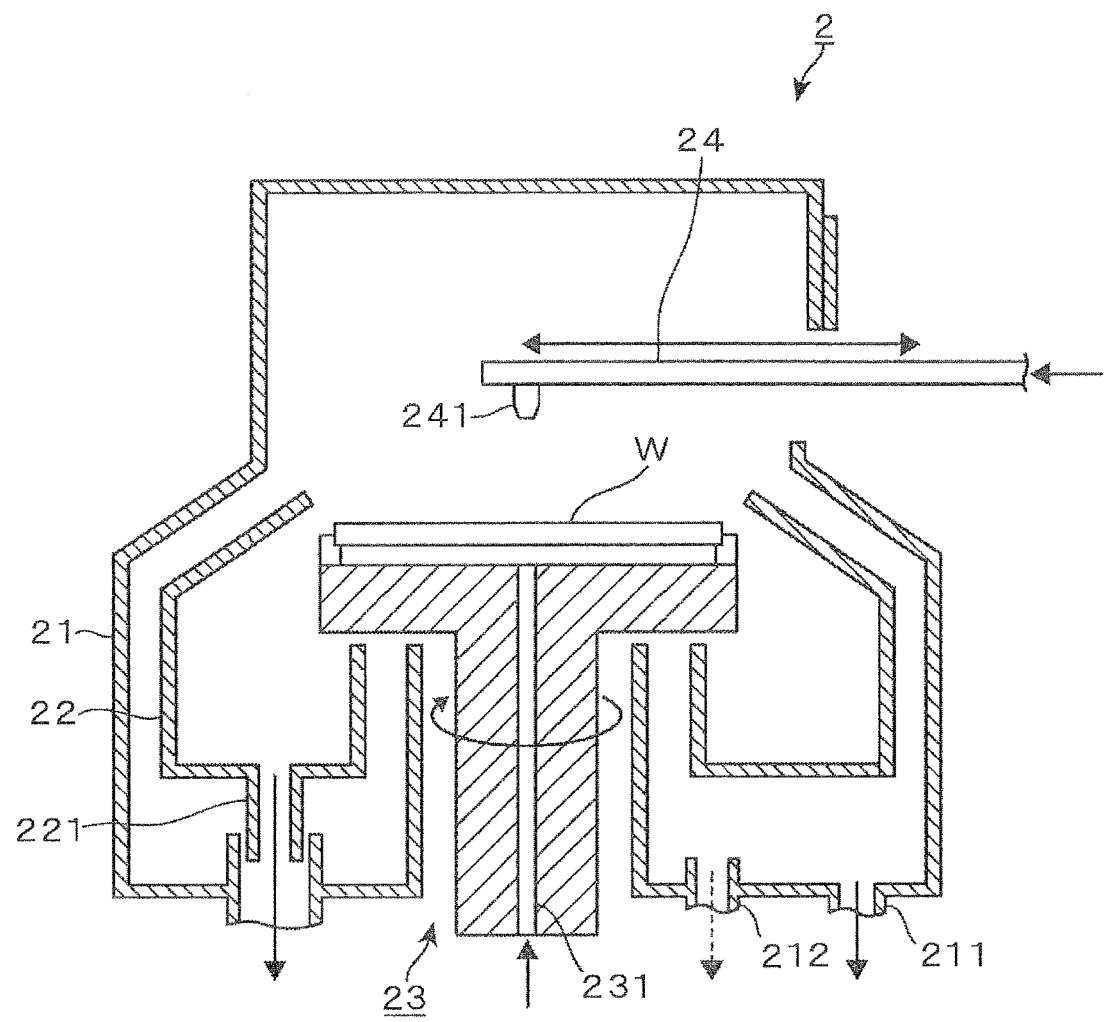
FIG. 3 is a vertical sectional side view of a cleaning apparatus provided in the cleaning system.

FIG. 1 is a cross-sectional plan view showing the overall construction of the cleaning system 1, and FIG. 2 is an external perspective view of the cleaning system 1. In these Figures, the left side will be referred to as the anterior side. In the cleaning system 1, FOUPs 100 are placed on a loading section 11. A plurality of wafers W, e.g. having a diameter of 300 mm, stored in each FOUP 100 is transferred between the FOUP and a cleaning section 14, a supercritical processing section 15 via a carry-in/carry-out section 12 and a transfer section 13; the wafers W are sequentially carried into a cleaning apparatus 2 and a supercritical processing apparatus 3, where each wafer W is subjected to cleaning and to removal of an anti-drying liquid, respectively. In FIG. 1, reference numeral 121 denotes a first transport mechanism for transporting a wafer W between each FOUP 100 and the transfer section 13, and 131 denotes a transfer shelf which serves as a buffer for temporarily placing thereon a wafer W during its transportation between the carry-in/carry-out section 12 and the cleaning section 14, the supercritical processing section 15.

The cleaning section 14 and the supercritical processing section 15 are located in anterior and posterior positions along a wafer transport route 162 anteroposteriorly extending from an opening provided between it and the transfer section 13. The cleaning section 14 has two cleaning apparatuses 2, one each disposed on either side of the wafer transport route 162, while the supercritical processing section 15 has six supercritical processing apparatuses 3, three each disposed on either side of the wafer transport route 162.

A wafer W is transported between one of the cleaning apparatuses 2, one of the supercritical processing apparatuses 3 and the transfer section 13 by a second transfer mechanism 161 disposed in the wafer transport route 162. The numbers of the cleaning apparatuses 2 and the supercritical processing apparatuses 3, disposed in the cleaning section 14 and the supercritical processing section 15, may be arbitrarily selected depending on the number of wafers W to be processed per unit time, the difference in processing time between the cleaning apparatus 2 and the supercritical processing apparatus 3, etc. An optimal layout may be determined based on the numbers of the cleaning apparatuses 2 and the supercritical processing apparatuses 3, etc.

The cleaning apparatus 2 may be configured e.g. as a single wafer-cleaning apparatus which cleans wafers W in a one-by-one manner by spin cleaning. For example, as shown in the vertical sectional side view of FIG. 3, a wafer W is held in an approximately horizontal position by a wafer holding mechanism 23 disposed in an outer chamber 21 which defines a processing space, and the wafer W is rotated by rotating the wafer holding mechanism 23 on a vertical axis. A nozzle arm 24 is allowed to enter the outer chamber 21 and move to above the rotating wafer W, and a liquid chemical and a rinsing liquid are supplied in a predetermined order from a chemical nozzle 241 provided at the front end of the nozzle arm 24, thereby cleaning the surface of the wafer W. A chemical supply passage 231 is formed in the wafer holding mechanism 23. The back surface of the wafer W can be cleaned with a liquid chemical and a rinsing liquid supplied from the chemical supply passage 231.

Cleaning of a wafer W may, for example, be carried out as follows: removal of particles or an organic contaminant with an SC1 liquid (mixture of ammonia and hydrogen peroxide water) which is an alkaline chemical→rinsing with DIW (deionized water) as a rinsing liquid→removal of a natural oxide film with DHF (diluted hydrofluoric acid) which is an acidic chemical→rinsing with DIW. Such liquids are received by an inner cup 22 or the outer chamber 21, and discharged from drainage ports 221, 211. The atmosphere in the outer chamber 21 is exhausted from an exhaust port 212.

Upon the completion of cleaning of the wafer W, the rotation of the wafer holding mechanism 23 is stopped, and then anti-drying IPA (isopropyl alcohol) is supplied to the wafer W to replace DIW, remaining on the front and back surfaces of the wafer W, with the IPA. The wafer W, which is covered with IPA (IPA liquid film), is transferred to the second transport mechanism 161 e.g. by a not-shown transfer mechanism provided in the wafer holding mechanism 23 and carried out of the cleaning apparatus 2.

The IPA, which has been supplied onto the surface of the wafer W in the cleaning apparatus 2, acts as an anti-drying liquid for preventing the occurrence of pattern collapse due to evaporation (vaporization) of the IPA during transportation of the wafer W from the cleaning apparatus 2 to the supercritical processing apparatus 3 or during the operation of carrying the wafer W into the supercritical processing apparatus 3.

The wafer W, which has undergone cleaning in the cleaning apparatus 2 and is covered with anti-drying IPA, is transported to the supercritical processing apparatus 3, where the wafer W is subjected to processing to dry the wafer W by removing the IPA in a high-pressure state. The construction of the supercritical processing apparatus 3 according to an embodiment of the present invention will now be described with reference to FIGS. 4 and 5. The supercritical processing apparatus 3 includes a processing container 31 for performing processing to remove an anti-drying liquid IPA from a wafer W, a pressurized fluid tank 35 for supplying a pressurized fluid to the processing container 31, and a $CO_2$ supply section 37 for supplying carbon dioxide ($CO_2$) gas, the material of the pressurized fluid, to the pressurized fluid tank 35 via a booster pump 36.

Figure 5:
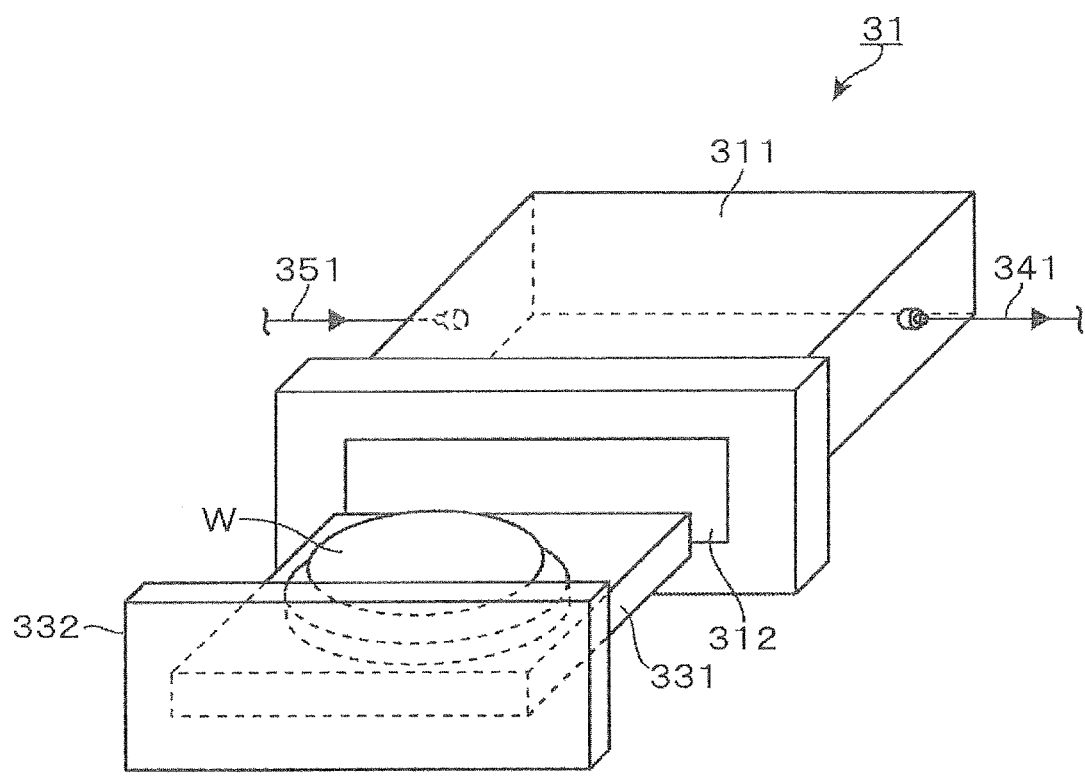
FIG. 5 is an external perspective view of the processing container of the supercritical processing apparatus.

As shown in FIG. 5, the processing container 31 includes a box-like container body 311 having an opening 312 for transfer of a wafer W, a holding plate 331 for holding the wafer W as a processing object in a horizontal position, and a lid member 332 which supports the holding plate 331 and, when the wafer W is carried into the container body 311, hermetically closes the opening 312.

The container body 311 is a container having a processing space of about 200 to 10000 $cm^3$ and capable of housing a wafer W e.g. having a diameter of 300 mm. A pressurized fluid supply line 351 for supplying the pressurized fluid into the processing container 31, and a discharge line 341 for discharging a fluid from the processing container 31 are connected to the wall portion of the container body 311. The processing container 31 is provided with a not-shown pressing mechanism for pressing the lid member 332 toward the container body 311 against the internal pressure of the high-pressure processing fluid supplied into the processing space, thereby hermetically sealing the processing space.

The container body 311 is provided with a heater 322 as a heating section, e.g. comprised of a resistance heating element, so that a wafer W in the processing container 31 can be heated to a preset temperature by heating the container body 311. The amount of heat generated by the heater 322 can be changed by the power supplied from a power feeding section 321. Based on the results of temperature detection obtained from a not-shown temperature detection section, the internal temperature of the processing container 31 is adjusted to a temperature higher than the critical temperature of IPA (235° C.), for example 250° C.

The pressurized fluid supply line 351, connected to the processing container 31, is connected to the pressurized fluid tank 35 via an on-off valve 352 which opens when supplying the pressurized fluid to the processing container 31 and closes when stopping the supply of the pressurized fluid. The $CO_2$ in the pressurized fluid tank 35 pressurizes the internal atmosphere of the processing container 31, e.g. heated to 250° C., to a pressure higher than the vapor pressure of IPA so as to prevent vaporization of IPA, thereby preventing the occurrence of pattern collapse. The pressurized fluid tank 35 may be provided with a heater or covered with a heat insulating material in order to keep the $CO_2$ in the tank at a temperature not less than the critical temperature.

Figure 4:
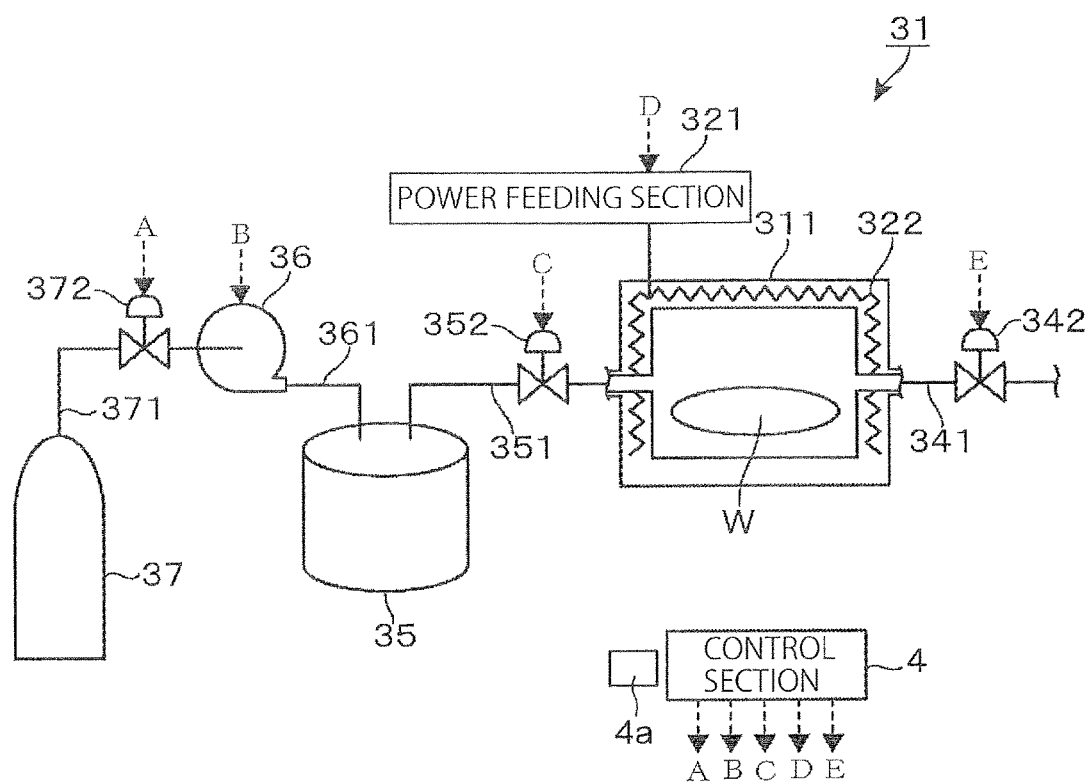
FIG. 4 is a diagram showing the construction of a supercritical processing apparatus according to an embodiment of the present invention.

The booster pump 36 adiabatically compresses $CO_2$, which is held e.g. in a liquid state in the $CO_2$ supply section 37, and feeds the $CO_2$ in a supercritical state to the pressurized fluid tank 35. A syringe pump or a diaphragm pump, for example, may be used as the booster pump 36. In FIG. 4, reference numeral 361 denotes a discharge line from the booster pump 36, 371 denotes a $CO_2$ supply line for supplying $CO_2$ from the $CO_2$ supply section 37 to the booster pump 36, and 372 denotes an on-off valve.

The cleaning system 1, the cleaning apparatus 2 and the supercritical processing apparatus 3, having the above-described constructions, are connected to a control section 4 as shown in FIGS. 1 and 4. The control section 4 is comprised of a computer including a CPU and a storage unit. The storage unit stores a program containing steps (commands) for control of the operations of the cleaning system 1, the cleaning apparatus 2 and the supercritical processing apparatus 3 in the process comprising taking a wafer W out of the FOUP 100, cleaning the wafer W in the cleaning apparatus 2, drying the wafer W in the supercritical processing apparatus 3, and carrying the wafer W into the FOUP 100. The program is stored in a storage medium 4a, such as a hard disk, a compact disk, a magneto-optical disk, a memory card, or the like, and is installed on the computer from the storage medium 4a.

In particular, the control section 4 outputs a control signal to the supercritical processing apparatus 3 so that $CO_2$ in a supercritical state, a pressurizing fluid, is supplied into the processing container 31 so as to change IPA (critical temperature 235° C., critical pressure 4.8 MPa (absolute pressure)), covering a wafer W that has been carried into the processing container 31, directly into the supercritical state (high-pressure state) before the IPA vaporizes to such an extent as to cause pattern collapse.

The operation of the supercritical processing apparatus 3 having the above-described construction will now be described with reference to FIGS. 6 through 9 illustrating the operation and FIGS. 10 through 13 schematically showing the state of a wafer W being processed. In FIGS. 6 through 9, the symbol "S" used for a valve indicates that the valve is closed, whereas the symbol "O" indicates that the valve is open.

A wafer W, which has been cleaned in the cleaning apparatus 2 in the above-described manner and is covered with anti-drying IPA, is transferred to the second transfer mechanism 161. The second transfer mechanism 161 then enters a housing in which a supercritical processing apparatus 3 which can receive the wafer W is disposed.

Figure 6:
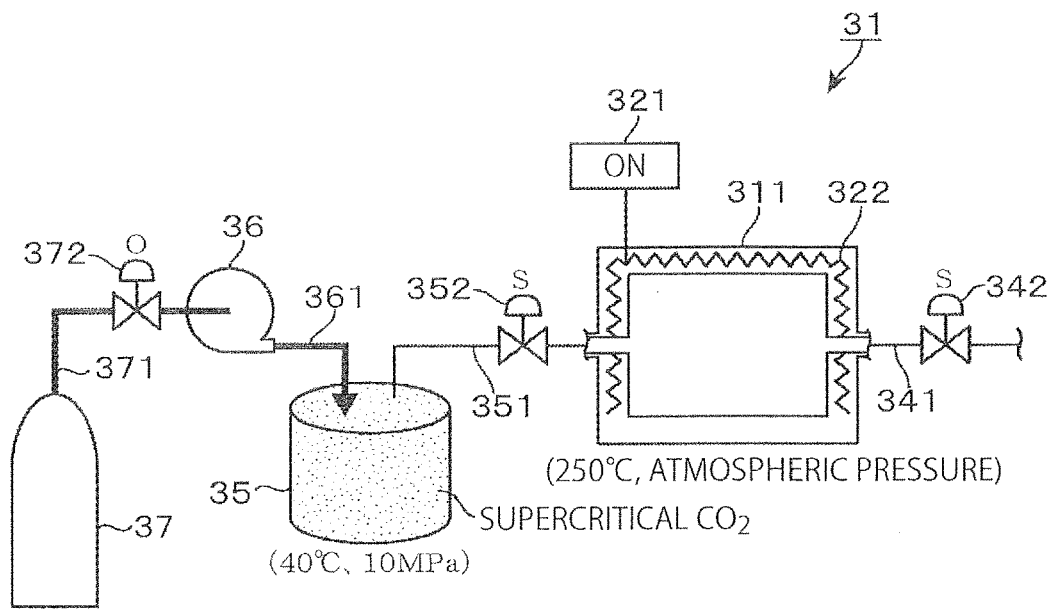
FIG. 6 is a first explanatory diagram illustrating the action of the supercritical processing apparatus.

As shown in FIG. 6, before the wafer W is carried into the supercritical processing apparatus 3, the apparatus is in a standby condition in which the power feeding section 321 for the heater 322 is on and the internal atmosphere of the container body 311 is kept at a temperature higher than the critical temperature of IPA, e.g. at 250° C., and at atmospheric pressure. The internal atmosphere is preferably made a low oxygen atmosphere by purging with an inert gas, such as $N_2$ gas, so that combustible IPA will not be brought into contact with oxygen at a relatively high concentration in the high-temperature atmosphere. On the other hand, the on-off valve 352 of the pressurized fluid supply line 351 is closed, and the pressurized fluid tank 35 has received from the $CO_2$ supply section 37 $CO_2$ which has been changed into the gaseous state by pressurization by means of the booster pump 36.

Figure 7:
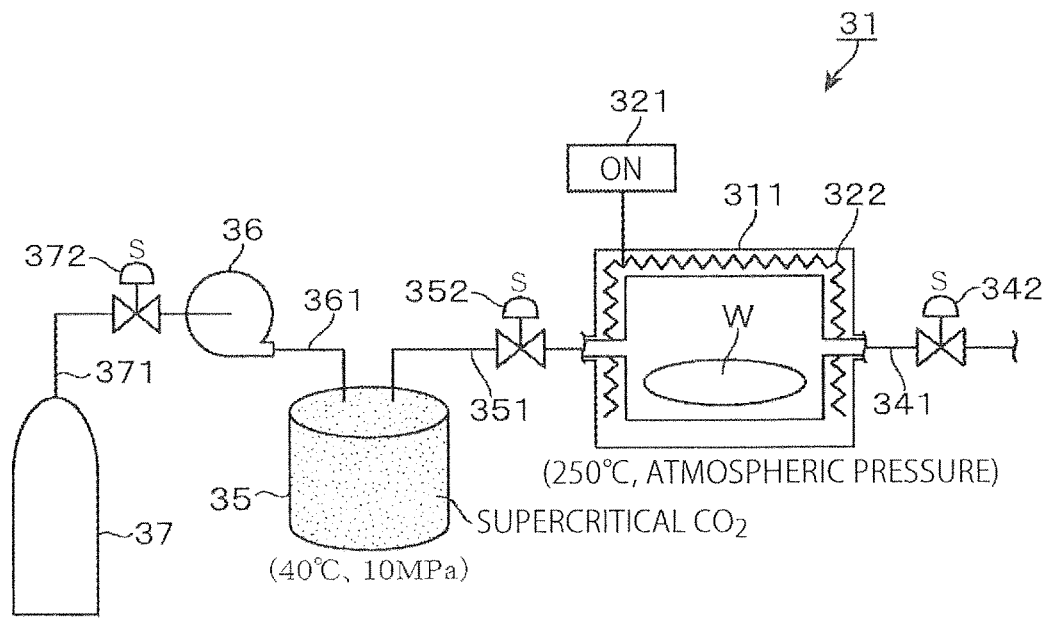
FIG. 7 is a second explanatory diagram illustrating the action of the supercritical processing apparatus.

When the wafer W is carried into the supercritical processing apparatus 3 which is thus ready for processing, the holding plate 331 is moved out of the container body 311 as shown in FIG. 5, and the wafer W is transferred from the transport arm of the second transport mechanism 161 to the holding plate 331 by means of not-shown support pins. The holding plate 331 is then moved to carry the wafer W into the container body 311 through the opening 312 and close the opening 312 with the lid member 332, thereby hermetically sealing the processing container 31 (FIG. 7). It is possible to again supply liquid IPA to the surface of the wafer W before transferring the wafer W to the holding plate 331.

Figure 10:
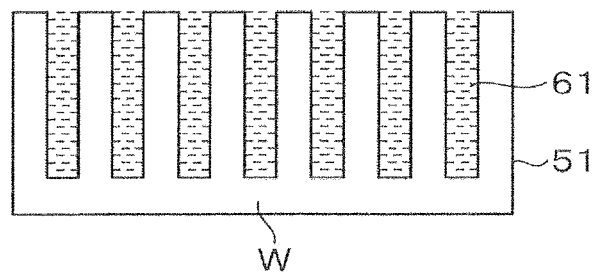
FIG. 10 is a first schematic diagram illustrating the state of a wafer being processed in the supercritical processing apparatus.

As described above, the internal atmosphere of the processing container 31 has been heated to 250° C., and therefore the temperature of the holding plate 331 is high. Accordingly, the wafer W and the IPA on the wafer are heated and the IPA vaporizes during the operation of transferring the wafer W to the holding plate 331 and carrying the wafer W into the processing container 31. If the liquid IPA 61 that covers the wafer W decreases and the liquid IPA 61, present in the recessed portions of the three-dimensional pattern 51, begins to vaporize as schematically shown in FIG. 10, then pattern collapse is likely to occur.

Figure 8:
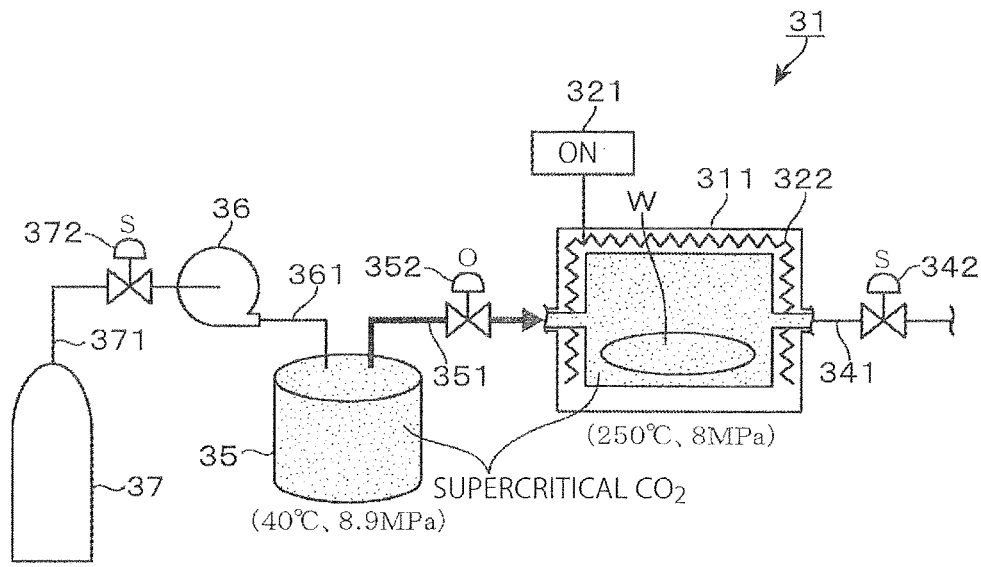
FIG. 8 is a third explanatory diagram illustrating the action of the supercritical processing apparatus.

In the supercritical processing apparatus 3 of this embodiment, therefore, the on-off valve 352 of the pressurized fluid supply line 351 is opened to introduce gaseous $CO_2$ into the processing container 31 as a fluid for pressurizing the internal atmosphere, as shown in FIG. 8, before the IPA vaporizes to such an extent as to cause pattern collapse. In the embodiment illustrated in FIG. 8, the pressure in the processing container 31 after the on-off valve 352 is opened is 6 MPa which is higher than the critical pressure of IPA and lower than the critical pressure of $CO_2$. It is also possible to use $CO_2$ in a supercritical state or a subcritical state (high-pressure state) as a pressurizing fluid.

Figure 11:
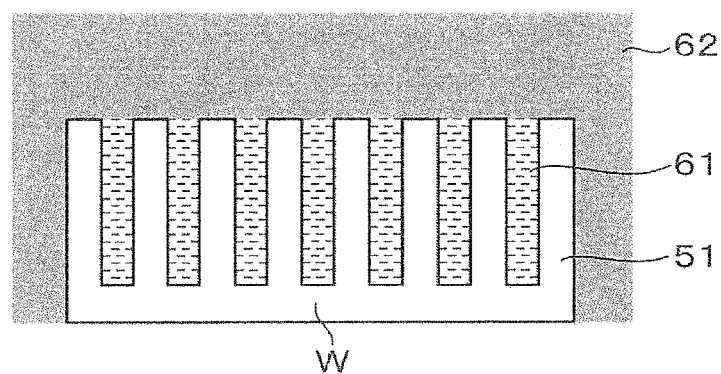
FIG. 11 is a second schematic diagram illustrating the state of the wafer being processed.
Figure 12:
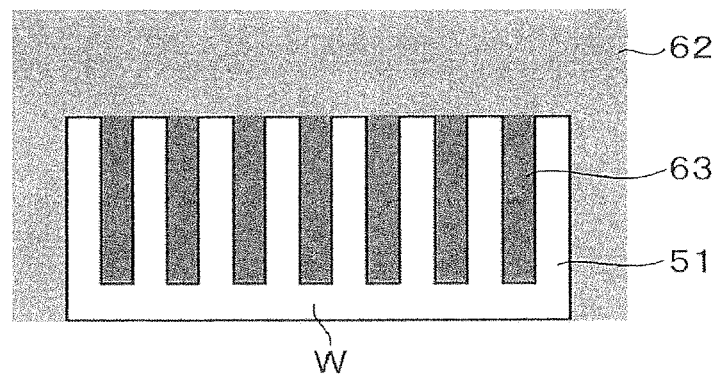
FIG. 12 is a third schematic diagram illustrating the state of the wafer being processed.

Upon the introduction of $CO_2$ gas 62 into the processing container, the liquid IPA 61, present in the recessed portions of the pattern 51 on the surface of the wafer W, becomes surrounded by the $CO_2$ gas 62 as shown in FIG. 11. Further, as described above, an atmosphere at a higher pressure than the vapor pressure of the liquid IPA 61 at the same temperature is formed by the pressure of $CO_2$ gas in a short time around the heated liquid IPA 61. It is known that when the liquid IPA 61 is left in contact with supercritical $CO_2$ for a long time, the liquid IPA 61 in the recessed portions gradually dissolves in supercritical $CO_2$ and the fluid in the recessed portions gradually becomes replaced with supercritical $CO_2$. However, because the internal atmosphere of the processing container 31 has been preheated to a temperature higher than the critical temperature of IPA in the supercritical processing apparatus 3 of this embodiment, the liquid IPA 61 on the surface of the wafer W is heated to a temperature higher than the critical temperature while it is kept in a liquid state under a high-pressure atmosphere. Thus, the liquid IPA 61 in the recessed portions of the three-dimensional pattern, while kept in the recessed portions, becomes the supercritical state before it is replaced with supercritical $CO_2$ (FIG. 12).

The present inventors are aware of the fact that when IPA in an amount of about 5 to 50 cc is applied to the surface of a 300-mm wafer W, all the IPA on the wafer W vaporizes in the processing container 31 in about 10 seconds from the time when the wafer W is transferred to the holding plate 331. Therefore, the on-off valve 352 is opened to start raising the internal pressure of the processing container 31 immediately, e.g. within 0.5 to 5 seconds, after the wafer W is carried into the processing container 31 and the lid member 332 is fixed. When the internal space of the processing container 31 has a volume of about 200 to 10000 cm³ as described above, it is possible to raise the pressure in the processing container 31 from atmospheric pressure to 8 MPa in about 1 to 60 seconds. Thus, it is possible to bring the atmosphere surrounding the wafer W into a high-pressure atmosphere before pattern collapse occurs.

Even if the liquid IPA 61, covering the surface of the wafer W, is blown off by the gaseous $CO_2$ supplied rapidly, the occurrence of pattern collapse can be prevented by quickly forming the atmosphere surrounding the wafer W, shown in FIG. 11, i.e. the atmosphere of gaseous $CO_2$ 62 that covers the liquid IPA 61.

Further, compared to the technique of replacing the liquid IPA 61 with supercritical $CO_2$, described above in the chapter background art, the liquid IPA 61, which has entered the pattern 51, can be changed into supercritical IPA 63 directly and thus in a shorter time according to the method of the present invention. Furthermore, the use of $CO_2$ in a gaseous state as a pressurizing fluid can reduce the number of particles as compared to the use of $CO_2$ in a supercritical state.

Figure 9:
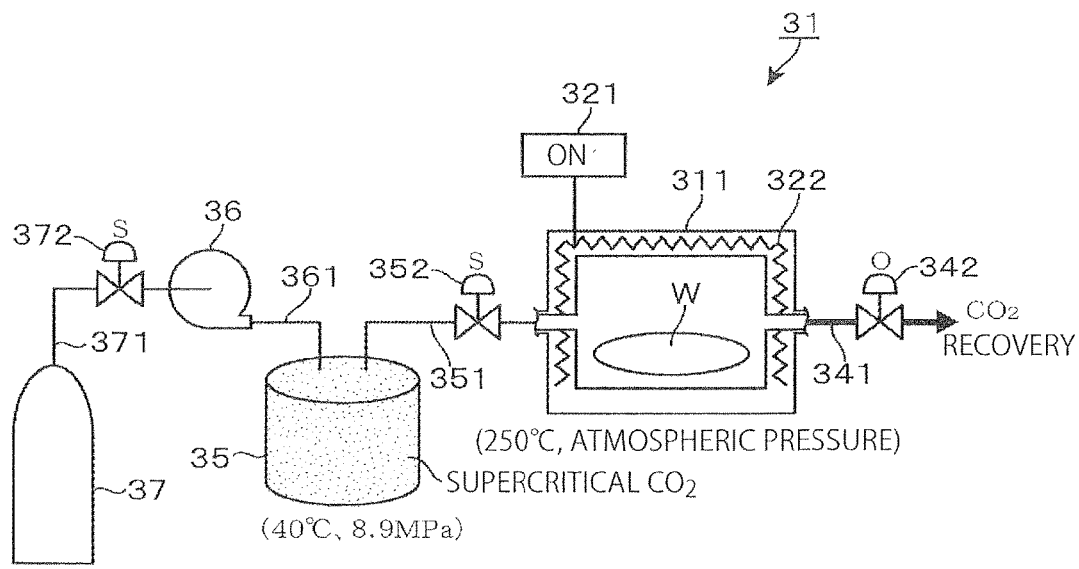
FIG. 9 is a fourth explanatory diagram illustrating the action of the supercritical processing apparatus.

After a sufficient time for the liquid IPA 61 in the pattern 51 of the wafer W to become the supercritical IPA 63 has elapsed since the start of the supply of gaseous $CO_2$ into the processing container 31, the on-off valve 352 of the pressurized fluid supply line 351 is closed, while the pressure reducing valve 342 of the discharge line 341 is opened to discharge a fluid from the processing container 31, as shown in FIG. 9. Because the temperature of the processing container 31 has been adjusted to 250° C. which is higher than the boiling point of IPA (82.4° C.), $CO_2$ gas and IPA, in a supercritical state or a gaseous state, are discharged from the processing container 31.

Figure 13:
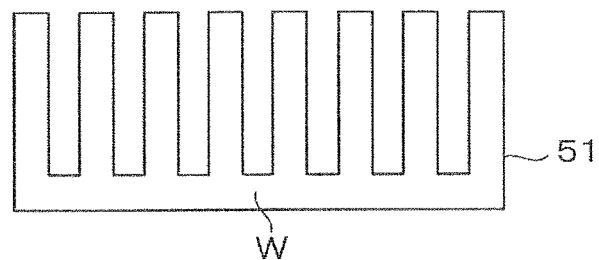
FIG. 13 is a fourth schematic diagram illustrating the state of the wafer being processed.
Figure 14:
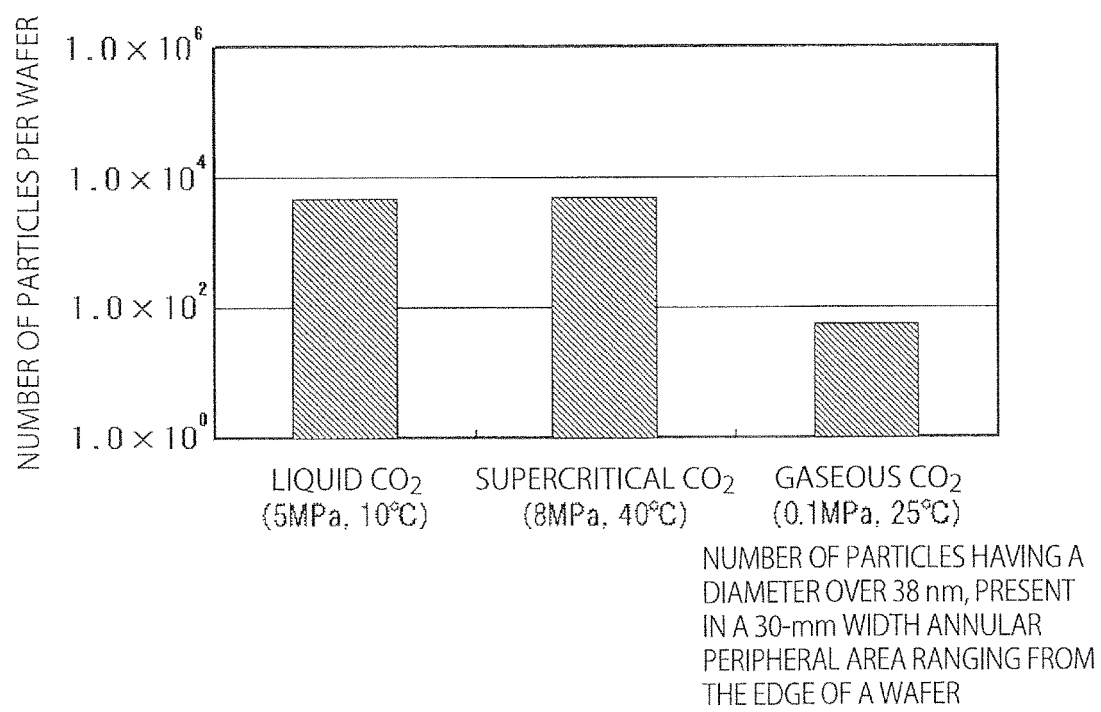
FIG. 14 is a graph showing the number of particles on a wafer as observed when a rinsing liquid on the wafer is mixed with liquid $CO_2$, supercritical $CO_2$ or gaseous $CO_2$.

Consequently, the internal pressure of the processing container 31 decreases to atmospheric pressure, and the liquid IPA 61 is removed from the pattern 51 as shown in FIG. 13. The wafer W in a dried state can thus be obtained.

After the liquid IPA has thus been removed and the wafer W has become dried, the holding plate 331 is moved to carry the wafer W out of the processing container 31, and the wafer W is transferred to the transport arm of the second transport mechanism 161. Thereafter, the wafer W is transferred to the first transport mechanism 121 via the transfer shelf 131, and is transported along the opposite route to that along which it has previously been transported, and placed in the FOUP 100. The sequence of operations for the wafer W is thus completed.

It is possible to provide the cleaning system 1 with a cooling apparatus for cooling a wafer W, which has been heated in the processing container 31, by holding the wafer W in an atmosphere in which the wafer W is in contact with a flow of clean air, and to cool a wafer W, taken out of the supercritical processing apparatus 3, by means of the cooling apparatus before the wafer W is placed in the FOUP 100.

The supercritical processing apparatus 3 of this embodiment has the following advantageous effects: A wafer W with the anti-drying liquid IPA 61 attached is heated while forming a high-pressure atmosphere in the processing container 31 by supplying a pressurizing fluid in a high-pressure state, in particular $CO_2$ in a gaseous state or $CO_2$ in a supercritical state, into the processing container 31, whereby the liquid IPA 61 is changed directly into the supercritical IPA 63 while keeping the fluid in the recessed portions of the three-dimensional pattern 51. This method makes it possible to remove the liquid IPA 61 from the wafer W in a short time while preventing the occurrence of pattern collapse and reducing the number of particles as compared to the method of bringing supercritical $CO_2$ into contact with the liquid IPA 61 present in the pattern 51 to replace the liquid IPA with the supercritical $CO_2$. The method of changing the liquid IPA 61, which has entered the three-dimensional pattern 51, directly into the supercritical IPA 63 and removing it, according to the present invention, is especially useful when the pattern 51 has a high aspect ratio, such as not less than 10, or when the pattern opening area, i.e. the area of contact between IPA and $CO_2$, is small such as when the design rule is not more than 20 nm.

The pressurizing fluid to be supplied to the processing container 31 is not limited to $CO_2$ in a gaseous or supercritical state. For example, $CO_2$ in a subcritical state may also be used. It is also possible to use nitrogen ($N_2$) in a supercritical state, pressurized to a pressure higher than the critical pressure of IPA, e.g. 5 MPa, or an inert fluid (gas, supercritical fluid or subcritical fluid) such as argon. It is also possible use supercritical IPA or subcritical IPA as a pressurizing fluid. Any pressurizing fluid may be used though it is preferred from the viewpoint of preventing pattern collapse that the fluid will not be liquid when an anti-drying liquid (such as IPA) is in a high-pressure state (supercritical state or subcritical state).

The internal atmosphere of the processing container 31 may not necessarily be preheated to a temperature higher than the critical temperature of the anti-drying liquid. As described above, a high-pressure atmosphere is formed in the processing container 31 in a short time, whereby vaporization of the anti-drying liquid is inhibited. Therefore, the internal temperature of the processing container 31 may be raised, after the formation of the high-pressure atmosphere, to form an atmosphere which turns the anti-drying liquid into the supercritical state.

The present invention is not limited to the use of IPA as an anti-drying liquid. It is also possible to use other alcohols such as methanol and ethanol, various fluorine-containing solvents (fluorinated alcohol, hydrofluoroether, etc.), acetone, etc. A wafer W covered with an anti-drying liquid may be carried into the processing container 31 after purging the processing container 31 with an inert gas, even when the anti-drying liquid is an incombustible one, e.g. for the purpose of preventing deterioration of the anti-drying liquid in a high-pressure state.

It is not always necessary to use an anti-drying liquid by applying it to the surface of a wafer W. For example, it is possible to put a wafer W in an open-top dish-shaped container filled with an anti-drying liquid, dispose the container, with the wafer W immersed in the anti-drying liquid, in the processing container 31, and change the liquid into a high-pressure state in an atmosphere pressurized by a pressurizing fluid.

The anti-drying liquid adhering to a wafer W, upon its removal from the wafer W, need not necessarily be changed into the supercritical state; it is of course possible to change the anti-drying liquid into the subcritical state. In that case, the phrase "not less than the critical temperature of the anti-drying liquid" as used in the claims means "not less than a temperature at which the anti-drying liquid becomes the subcritical state". Furthermore, the phrase "pressurized to a pressure not less than the critical pressure of the anti-drying liquid" as used in the claims means "pressurized to a pressure not less than a pressure at which the anti-drying liquid becomes the subcritical state".

The processing container 31 of this embodiment is configured to heat the entire pressure-resistant container as shown in FIG. 4. The present invention, however, is not limited to the use of such a processing container. For example, it is possible to use a processing container having a nested structure, comprising an outer pressure-resistant container made of a material having a high pressure resistance and a relatively low thermal conductivity, such as stainless steel, carbon steel, titanium, Hastelloy (registered trademark), Inconel (registered trademark), or the like, and an inner container made of a material having a higher thermal conductivity than the outer pressure-resistant container, such as aluminum, copper, aluminum nitride, silicon carbide, or the like. A heat-insulating layer, e.g. made of quartz or alumina, may be provided between the inner and outer containers, and the processing container may be configured to heat only the inner container e.g. with the heater 322. This can enhance the thermal responsiveness of the processing container and reduce energy consumption.

Second Embodiment

A second embodiment of the present invention will now be described with reference to FIGS. 15 through 28. In the following description of the second embodiment, the same reference numerals are used for the same components or elements as those of the first embodiment shown in FIGS. 1 through 14, and a detailed description thereof will be omitted.

A wafer W, which has undergone cleaning in the cleaning apparatus 2 and is covered with anti-drying IPA, is transported to the supercritical processing apparatus 3, where the wafer W is subjected to processing to dry the wafer W by removing the IPA in a high-pressure state (see FIG. 1). The construction of the supercritical processing apparatus 3 according to a second embodiment of the present invention will now be described with reference to FIGS. 15 and 16. The supercritical processing apparatus 3 includes a processing container 31A for performing processing to remove an anti-drying liquid IPA from a wafer W, and a pressurized fluid supply section 36A for supplying a gas for pressurizing the internal atmosphere of the processing container 31A.

Figure 16:
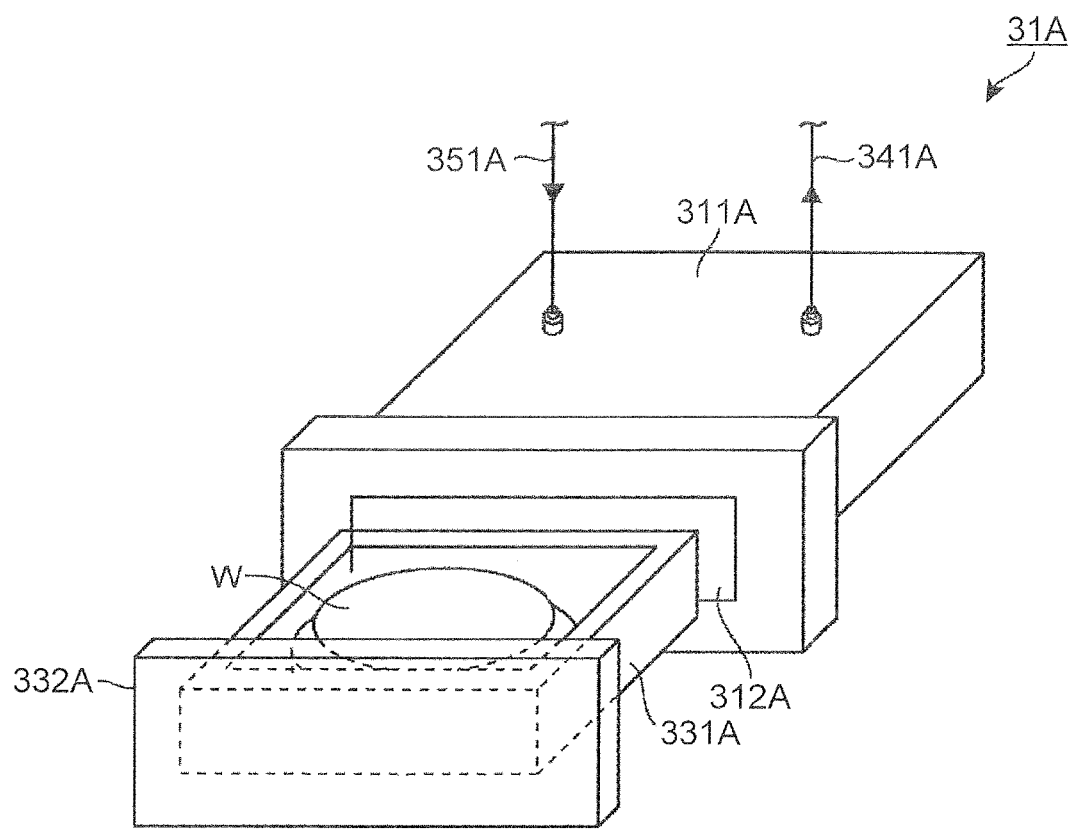
FIG. 16 is an external perspective view of the processing container of the supercritical processing apparatus.

As shown in FIG. 16, the processing container 31A includes a box-like container body 311A having an opening 312A for transfer of a wafer W, a wafer tray 331A capable of holding the wafer W as a processing object in a horizontal position while keeping the wafer W immersed in liquid IPA, and a lid member 332A which supports the wafer tray 331A and, when the wafer W is carried into the container body 311A, hermetically closes the opening 312A.

The container body 311A is a container having a processing space of about 200 to 10000 $cm^3$ and capable of housing a wafer W e.g. having a diameter of 300 mm. A pressurized fluid supply line 351A for supplying the pressurized fluid into the processing container 31A, and a discharge line 341A for discharging a fluid from the processing container 31A are connected to the upper surface of the container body 311A. The processing container 31A is provided with a not-shown pressing mechanism for pressing the lid member 332A toward the container body 311A against the internal pressure of the high-pressure processing fluid supplied into the processing space, thereby hermetically sealing the processing space.

The container body 311A is provided with a heater 322A as a heating section, e.g. comprised of a resistance heating element, and a temperature detection section 323A including a thermocouple for detecting the internal temperature of the processing container 31A, so that a wafer W in the processing container 31A can be heated to a preset temperature by heating the container body 311A. The amount of heat generated by the heater 322A can be changed by the power supplied from a power feeding section 321A. Based on the results of temperature detection obtained from the temperature detection section 323A, the internal temperature of the processing container 31A is raised according to a predetermined temperature rise schedule.

Figure 15:
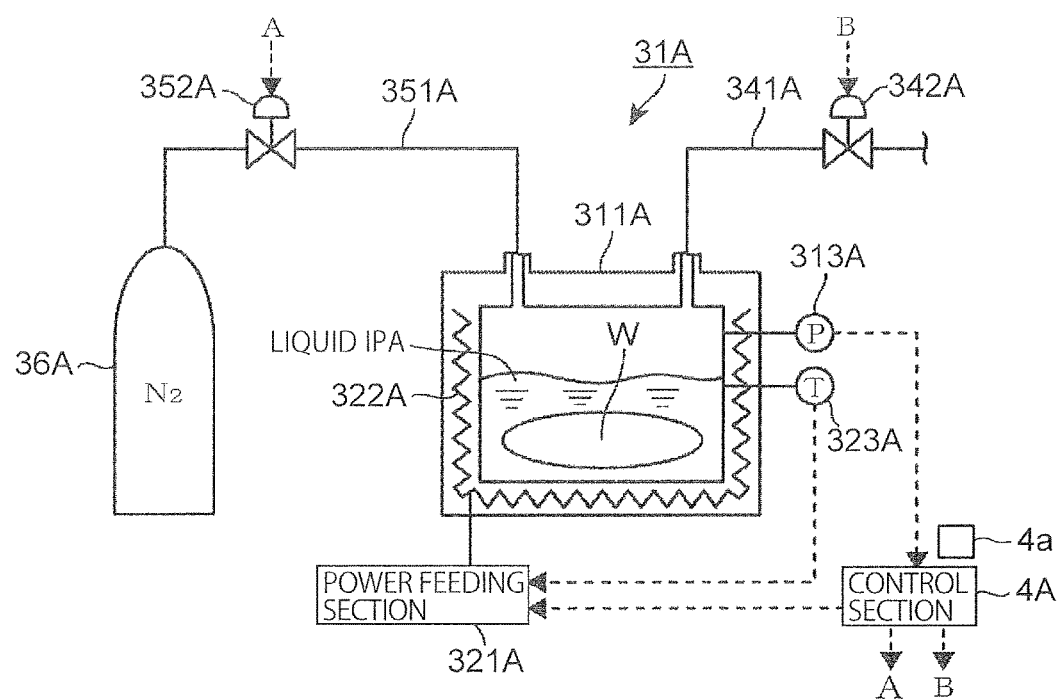
FIG. 15 is a diagram showing the construction of a supercritical processing apparatus according to a second embodiment of the present invention.

A high-pressure gas (nitrogen gas in this embodiment) for pressurizing the interior of the processing container 31A to a pressure of about 0.1 to 6 MPa, which is higher than atmospheric pressure, is held in the pressurized fluid supply section 36A. In FIG. 15, reference numeral 351A denotes a pressurized fluid supply line for supplying a pressurized fluid from the pressurized fluid supply section 36A to the processing container 31A, and 352A denotes a pressure reducing valve which, based on the detection results of a pressure detection section 313A provided in the processing container 31A, adjusts the amount of the pressurized fluid to be supplied so that the pressure in the processing container 31A will be adjusted to the above-described pressure.

The cleaning system 1, the cleaning apparatus 2 and the supercritical processing apparatus 3, having the above-described constructions, are connected to a control section 4A as shown in FIGS. 1 and 15. The control section 4A is comprised of a computer including a CPU and a storage unit. The storage units stores a program containing steps (commands) for control of the operations of the cleaning system 1, the cleaning apparatus 2 and the supercritical processing apparatus 3 in the process comprising taking a wafer W out of the FOUP 100, cleaning the wafer W in the cleaning apparatus 2, drying the wafer W in the supercritical processing apparatus 3, and carrying the wafer W into the FOUP 100. The program is stored in a storage medium 4a, such as a hard disk, a compact disk, a magneto-optical disk, a memory card, or the like, and is installed on the computer from the storage medium 4a.

In particular, the control section 4A outputs a control signal to the supercritical processing apparatus 3 so that the liquid IPA in the processing container 31A (in the wafer tray 331A), in which the wafer W is immersed, is heated in a pressurized atmosphere and changed into the supercritical state (high-pressure state) while preventing boiling of the IPA, thereby removing the liquid without the occurrence of pattern collapse.

Figure 19:
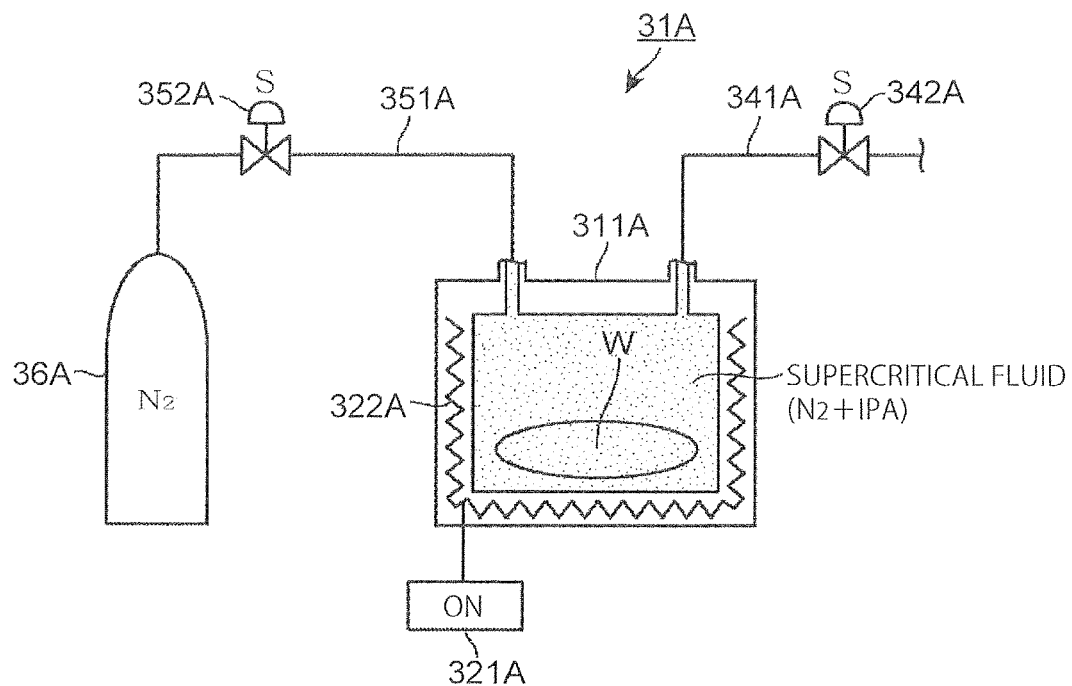
FIG. 19 is a third explanatory diagram illustrating the action of the supercritical processing apparatus.
Figure 20:
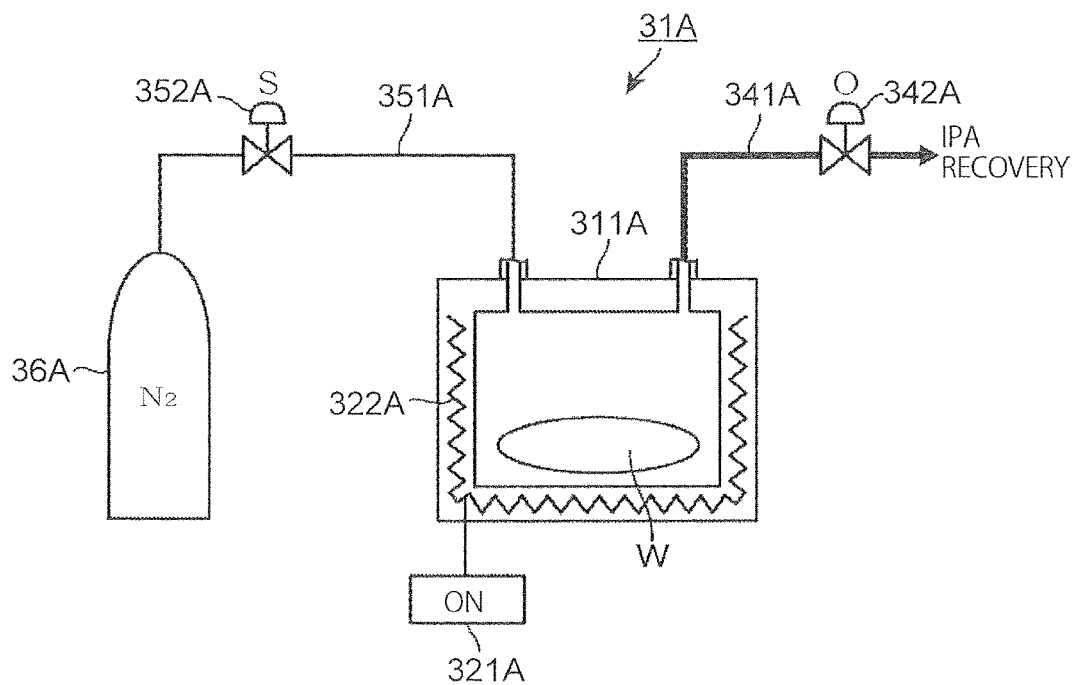
FIG. 20 is a fourth explanatory diagram illustrating the action of the supercritical processing apparatus.
Figure 21:
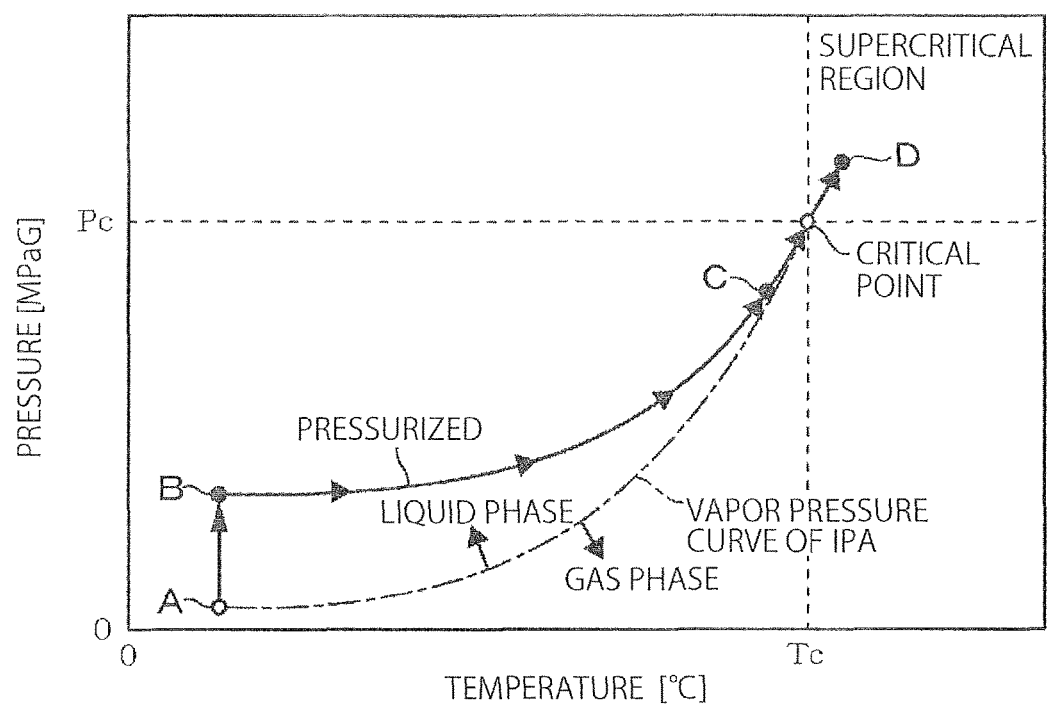
FIG. 21 is an explanatory diagram illustrating the temperature-pressure state of the internal atmosphere of the processing container of the supercritical processing apparatus.

The operation of the supercritical processing apparatus 3 having the above-described construction will now be described with reference to FIGS. 17 through 20 illustrating the operation and FIG. 21 illustrating the temperature-pressure state of the internal atmosphere of the processing container 31A during processing of a wafer W. The temperature-pressure state of IPA can be regarded as being substantially the same as the temperature-pressure state of the internal atmosphere of the processing container 31A when IPA is heated at a rate at which the gas-liquid equilibrium of IPA in the processing container 31A can be maintained or when an IPA film on the surface of a wafer W is so thin that the response rate of IPA upon heating is sufficiently high. Therefore, the following description of the temperature-pressure state of the internal atmosphere of the processing container 31A also applies to the temperature-pressure state of IPA on the surface of a wafer W unless otherwise stated. In FIGS. 17 through 20, the symbol "S" used for a valve indicates that the valve is closed, whereas the symbol "O" indicates that the valve is open.

A wafer W, which has been cleaned in the cleaning apparatus 2 in the above-described manner and is covered with anti-drying IPA, is transferred to the second transfer mechanism 161. The second transfer mechanism 161 then enters a housing in which a supercritical processing apparatus 3 which can receive the wafer W is disposed (see FIG. 1). Before the wafer W is carried into the supercritical processing apparatus 3, the apparatus is in a standby condition in which the power feeding section 321A for the heater 322A is off and the internal atmosphere of the container body 311A is kept at a temperature lower than the critical temperature of IPA (235° C.) and at atmospheric pressure. The internal atmosphere is preferably made a low oxygen atmosphere by purging with an inert gas, such as $N_2$ gas, so that combustible IPA will not be brought into contact with oxygen at a relatively high concentration in a high-temperature atmosphere after heating of the processing container 31A with the heater 322A is started.

Figure 17:
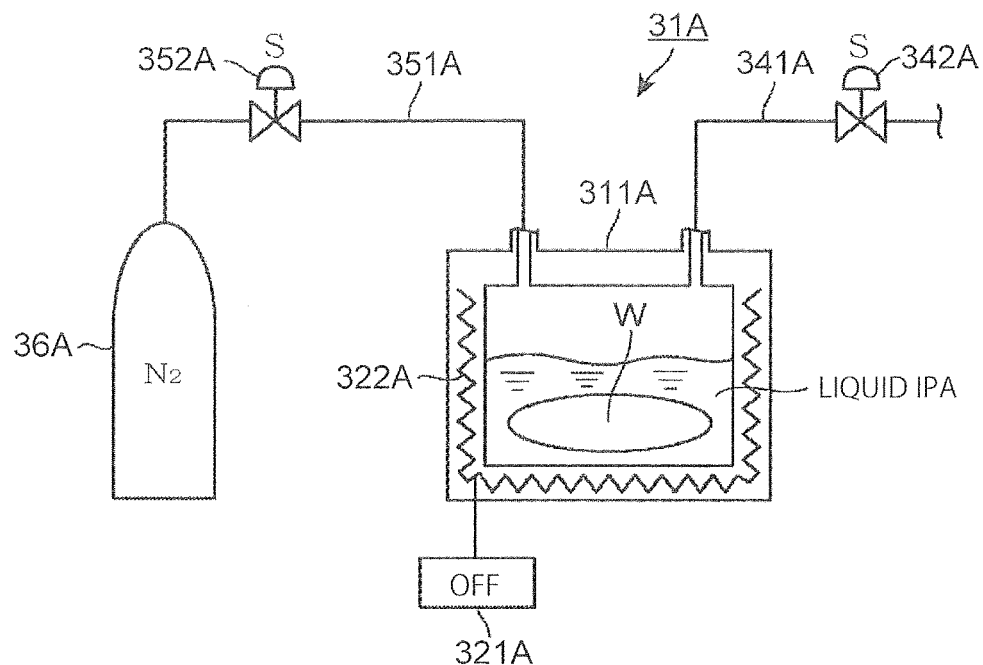
FIG. 17 is a first explanatory diagram illustrating the action of the supercritical processing apparatus.
Figure 18:
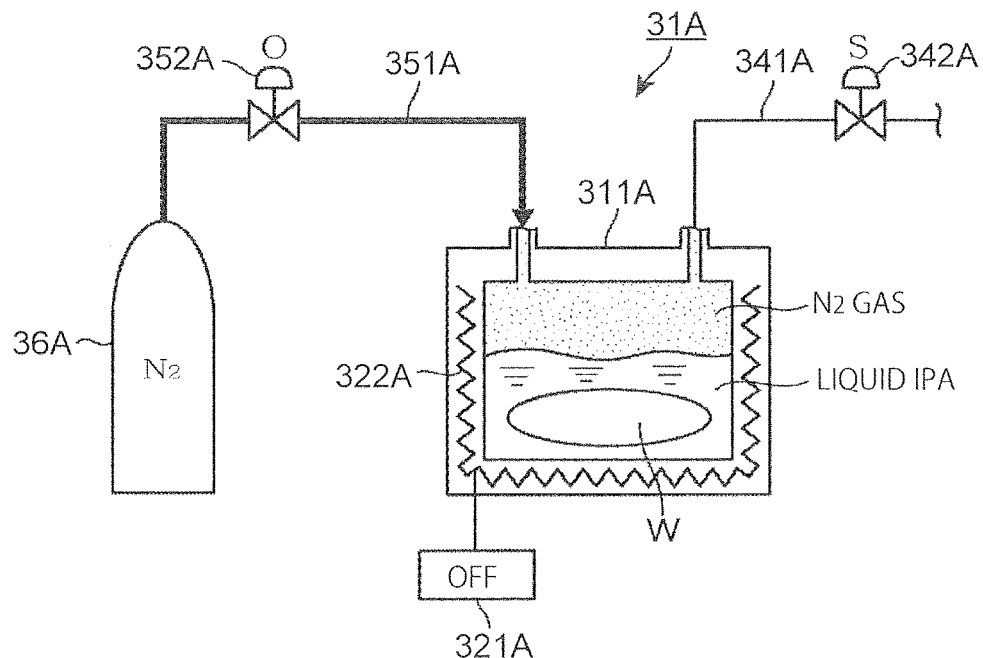
FIG. 18 is a second explanatory diagram illustrating the action of the supercritical processing apparatus.

When the wafer W is carried into the supercritical processing apparatus 3 which is ready for processing, the wafer tray 331A is moved out of the container body 311A as shown in FIG. 16, and the wafer W is transferred from the transport arm of the second transport mechanism 161 to the wafer tray 331A by means of not-shown support pins. Liquid IPA is then supplied from a not-shown IPA supply nozzle into the wafer tray 331A, whereby the wafer W is immersed in the liquid IPA. The wafer tray 331A is then moved to carry the wafer W into the container body 311A through the opening 312A and close the opening 312A with the lid member 332A, thereby hermetically sealing the processing container 31A (FIG. 17).

Because the IPA vaporizes in the narrow processing container 31A, the temperature-pressure state of the internal atmosphere of the processing container 31A corresponds to the white circle point A or its vicinity, the left end of the vapor pressure curve of IPA shown by the dashed-dotted line in FIG. 21. If the wafer W in the processing container 31A is heated rapidly in such an atmosphere, the IPA on the surface of the wafer W will boil and generate bubbles in the pattern, which may cause pattern collapse. On the other hand, if the wafer W is heated slowly such that the temperature-pressure state of the internal atmosphere of the processing container 31A changes along the vapor pressure curve of IPA without boiling of the IPA, the liquid IPA can be changed into the supercritical state and removed from the surface of the wafer W without the occurrence of pattern collapse. This manner, however, requires a long processing time.

The supercritical processing apparatus 3 of this embodiment therefore supplies a pressurized fluid into the processing container 31A and pressurizes the internal atmosphere in order to make the temperature-pressure state of the internal atmosphere of the processing container 31A deviate from the vapor pressure curve of IPA as shown by the black circle point B in FIG. 21, In the thus pressurized atmosphere, IPA is unlikely to boil if the wafer W is heated rapidly. Specifically, as show in FIG. 18, the pressure reducing valve 352A of the pressurized fluid supply line 351A is opened and the degree of opening is adjusted to adjust the pressure in the processing container 31A within the range of 0.1 to 6 MPa, e.g. to 0.5 MPa.

Thereafter, feeding of power from the power feeding section 321A to the heater 322A is started to heat the IPA in the processing container 31A. Because of the pressurization of the internal atmosphere of the processing container 31A, the temperature-pressure state of the internal atmosphere changes along a curve lying on the liquid phase side of the vapor pressure curve of IPA, as shown by the solid line with arrows in FIG. 21, during the heating. Thus, the liquid IPA maintains the liquid state during heating. Part of the IPA vaporizes, whereby the pressure in the processing container 31A increases. The heating rate is decreased when the temperature-pressure state of the internal atmosphere of the processing container 31A has come close to the vapor pressure curve of IPA (point C in FIG. 21), and heating is continued while avoiding boiling of the IPA.

When the temperature-pressure state of the internal atmosphere of the processing container 31A has reached the critical point of IPA (supercritical temperature 235° C., critical pressure 4.8 MPa (absolute pressure)), the entire internal atmosphere of the processing container 31A becomes a supercritical fluid as shown in FIG. 19. Thus, the liquid IPA present in the recessed portions of the three-dimensional pattern of the wafer W, together with the surrounding IPA, becomes a supercritical fluid in the recessed portions and can be removed from the surface of the wafer W without the occurrence of pattern collapse. The internal atmosphere of the processing container 31A actually is a mixture of fluids such as IPA, nitrogen as a pressurizing fluid, oxygen that has entered the processing container 31A upon carrying in of the wafer W, etc. When IPA is in a supercritical state, nitrogen and oxygen are each in a gaseous state or a supercritical state, and no liquid exists in the processing container 31A. Therefore, the liquid IPA on the surface of the wafer W can be removed without the occurrence of pattern collapse by bringing the IPA into a supercritical state.

After a sufficient time for all the liquid IPA in the processing container 31A to become the supercritical state has elapsed, the pressure reducing valve 352A of the pressurized fluid supply line 351A is closed, while the pressure reducing valve 342A of the discharge line 341A is opened to discharge a fluid from the processing container 31A, as shown in FIG. 20. Because the temperature of the processing container 31A has been adjusted to a temperature (e.g. 250° C.) higher than the boiling point of IPA (82.4° C.), $CO_2$ and IPA, either in a supercritical state or in a gaseous state, are discharged from the processing container 31A. Consequently, the internal pressure of the processing container 31A decreases to atmospheric pressure, and the liquid IPA 61A is removed from a pattern 51A. The wafer W in a dried state can thus be obtained. The method of changing the liquid IPA, which has entered the three-dimensional pattern, directly into the supercritical IPA and removing it, according to the present invention, is especially useful when the pattern has a high aspect ratio, such as not less than 10, or when the pattern opening area, i.e. the area of contact between IPA and $CO_2$, is small such as when the design rule is not more than 20 nm.

After the liquid IPA 61A has been removed and the wafer W has become dried, the wafer tray 331A is moved to carry the wafer W out of the processing container 31A, and the wafer W is transferred to the transport arm of the second transport mechanism 161. Thereafter, the wafer W is transferred to the first transport mechanism 121 via the transfer shelf 131, and is transported along the opposite route to that along which it has previously been transported, and placed in the FOUP 100. The sequence of operations for the wafer W is thus completed.

It is possible to provide the cleaning system 1 with a cooling apparatus for cooling a wafer W, which has been heated in the processing container 31A, by holding the wafer W in an atmosphere in which the wafer W is in contact with a flow of clean air, and to cool a wafer W, taken out of the supercritical processing apparatus 3, by means of the cooling apparatus before the wafer W is placed in the FOUP 100.

The supercritical processing apparatus 3 of this embodiment has the following advantageous effects: A wafer W with anti-drying liquid IPA attached is heated while pressurizing the interior of the processing container 31A so that the temperature-pressure state of the internal atmosphere of the processing container 31A changes along the vapor pressure curve of the liquid IPA or along a curve lying on the liquid phase side of the vapor pressure curve, and reaches a supercritical state. This method can change the liquid IPA into the supercritical state while avoiding boiling of the liquid IPA and while keeping the fluid in the recessed portions of the three-dimensional pattern 51A, making it possible to remove the liquid IPA from the wafer W while preventing the occurrence of pattern collapse.

The method of changing liquid IPA on a wafer W into the supercritical state while adjusting the temperature-pressure state of the liquid IPA (temperature-pressure state of the internal atmosphere of the processing container 31A) so as not to boil the liquid IPA is not only applicable to the case of removing liquid IPA from a wafer W immersed in the IPA, but is also applicable e.g. to the case of removing liquid IPA that has been applied onto and covers a patterned surface of a wafer W.

Figure 22:
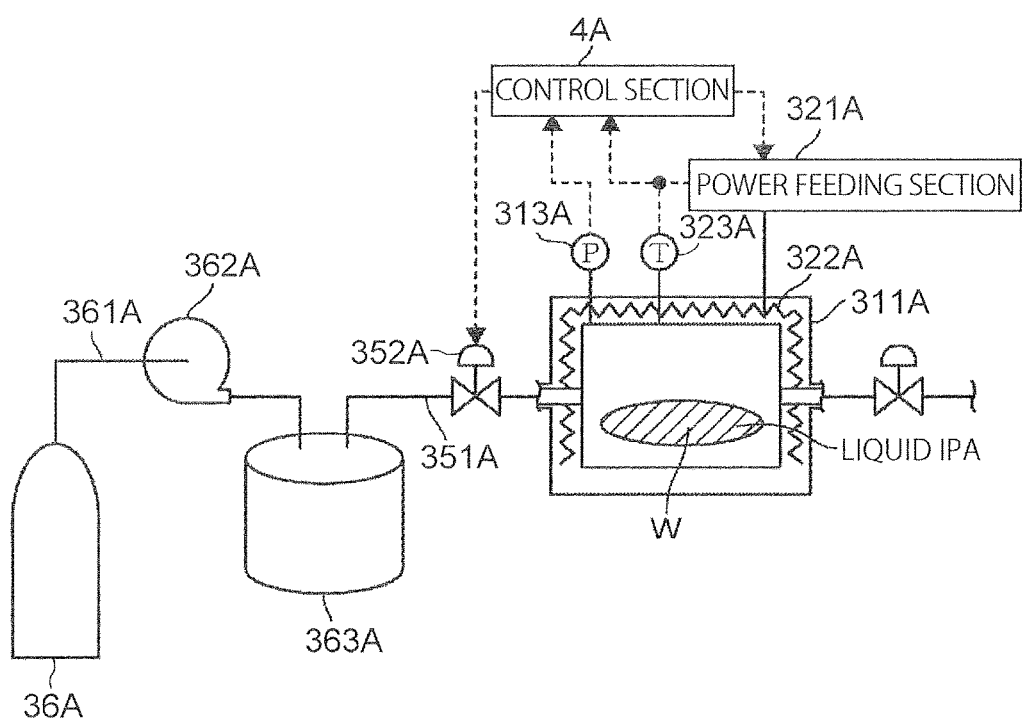
FIG. 22 is a diagram showing the construction of a supercritical processing apparatus according to another embodiment of the present invention.
Figure 23:
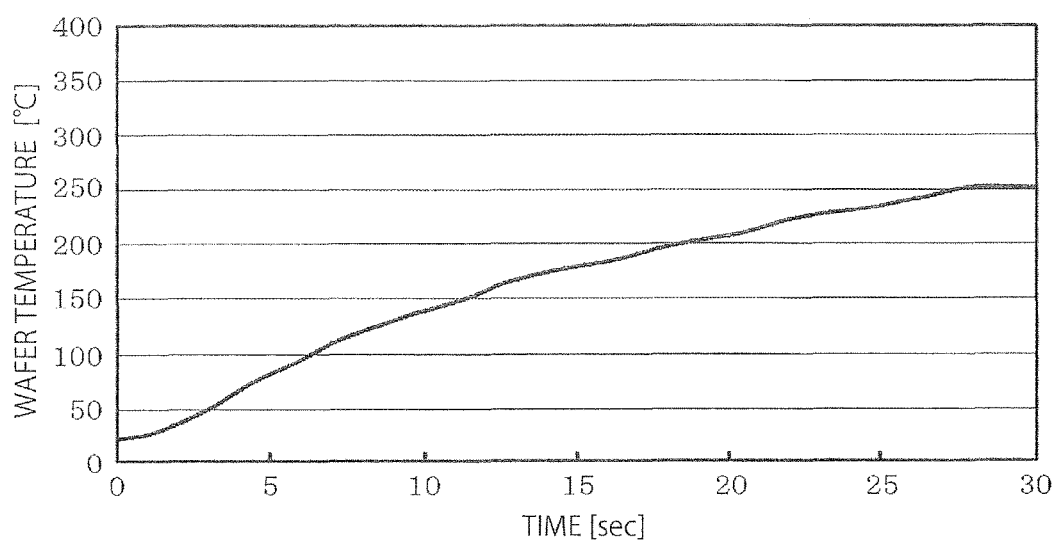
FIG. 23 is an explanatory diagram showing change in the temperature of a wafer in the processing container of the supercritical processing apparatus.

FIG. 22 show an exemplary construction of a supercritical processing apparatus 3 adapted to remove liquid IPA that covers the surface of a wafer W. The amount of liquid IPA that covers the surface of a wafer W is, in most cases, smaller than the amount of liquid IPA which has been supplied to the wafer tray 331A in such an amount as to be capable of immersing the entire wafer W. There is, therefore, a fear that even if all the liquid IPA in the processing container 31A is caused to evaporate after pressurizing the internal atmosphere of the processing container 31A with a pressurized fluid, the pressure in the processing container 31A could not be raised to a pressure at which the IPA turns into the supercritical state.

The supercritical processing apparatus 3 shown in FIG. 22 differs from the first embodiment in that instead of using the method of raising the pressure in the processing container 31A with the vapor of IPA generated by heating liquid IPA, the supercritical processing apparatus 3 of this embodiment uses the method of supplying a gas or a high-pressure fluid into the processing container 31A from the outside to form a high-pressure atmosphere, whose pressure is higher than the critical pressure of IPA, in the processing container 31A, thereby changing liquid IPA on a wafer W into the supercritical state while avoiding boiling of the IPA. In FIG. 22, the same reference numerals are used for the same components or elements as those of the supercritical processing apparatus 3 shown in FIG. 15.

The supercritical processing apparatus 3 shown in FIG. 22 differs from the supercritical processing apparatus 3 shown in FIG. 15 in that $CO_2$ in a liquid state is stored in the pressurized fluid supply section 36A, and that a booster pump 362A, e.g. comprised of a syringe pump or a diaphragm pump, for adjusting the pressure of the $CO_2$ to be supplied, and a pressurized fluid tank 363A for holding the pressure-adjusted $CO_2$ are provided between the pressurized fluid supply line 351A and the pressurized fluid supply section 36A. In the pressurized fluid tank 363A is held gaseous $CO_2$ in an amount sufficient to raise the pressure in the processing container 31A to a pressure higher than the critical pressure of IPA. In FIG. 22, reference numeral 361A denotes a $CO_2$ supply line for supplying $CO_2$ to the pressurized fluid tank 363A.

Both a temperature detection value from the temperature detection section 323A and a pressure detection value from the pressure detection section 322A are inputted into the control section 4A, so that the feeding of power to the heater 322A and the degree of opening of the pressure reducing valve 352A of the pressurized fluid supply line 351A can be adjusted while monitoring the temperature and the pressure of the internal atmosphere of the processing container 31A.

By determining, e.g. by a preliminary experiment, the relationship between the temperature of the processing container 31A and the temperature of a wafer W, covered with liquid IPA, upon heating of the processing container 31A, it is possible to estimate change with time in the temperature of the wafer W as the temperature of the processing container 31A is raised according to a predetermined schedule. Assuming that the temperature of liquid IPA, covering the surface of a wafer W, shows the same change as the temperature of the wafer W, the liquid IPA can be changed into the supercritical state while preventing boiling of the liquid IPA by keeping the pressure in the processing container 31A higher than the vapor pressure of IPA at a given temperature at a given time.

Figure 24:
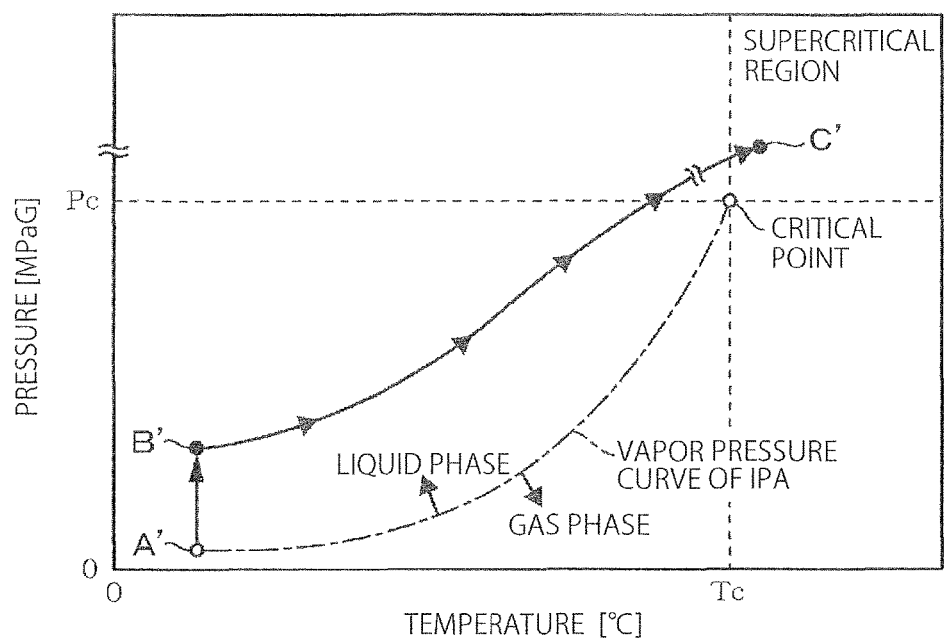
FIG. 24 is an explanatory diagram illustrating the temperature-pressure state of the internal atmosphere of the processing container of the supercritical processing apparatus.

The supercritical processing apparatus 3 of this embodiment therefore adjusts the degree of opening of the pressure reducing valve 352A and the power output of the heater 322A so that liquid IPA, covering the surface of a wafer W, is heated while maintaining the liquid state, as shown in FIG. 24, and changed into the supercritical state.

Figure 25:
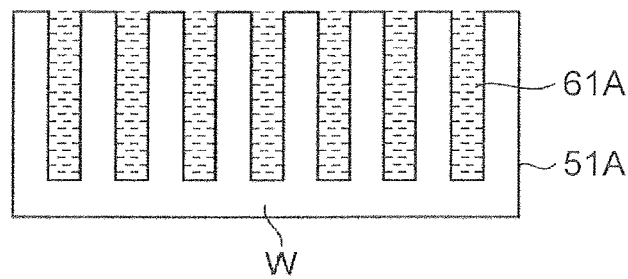
FIG. 25 is a first explanatory diagram illustrating the state of a wafer being processed in the supercritical processing apparatus.

In particular, after a wafer W covered with liquid IPA is carried into the processing container 31A, the liquid IPA vaporizes, and the temperature-pressure state of the internal atmosphere of the processing container 31A corresponds to the point A', shown in FIG. 24, or its vicinity on the vapor pressure curve of IPA. If the liquid IPA 61A covering the surface of the wafer W vaporizes and the liquid IPA 61A present in the recesses of the three-dimensional pattern 51A begins to vaporize as schematically shown in FIG. 25, there is a considerable fear of the occurrence of pattern collapse.

To prevent this, the pressure reducing valve 352A of the pressurized fluid supply line 351A, shown in FIG. 22, is gradually opened to supply gaseous $CO_2$ from the pressurized fluid tank 363A into the processing container 31A, thereby raising the pressure in the processing container 31A (point B' in FIG. 24). Thereafter, the temperature of the processing container 31A is raised according to a predetermined temperature rise schedule to heat the wafer W while the pressure reducing valve 352A is further opened to adjust the temperature-pressure state of the internal atmosphere of the processing container 31A so that the IPA on the wafer W can exist in a liquid form.

Figure 26:
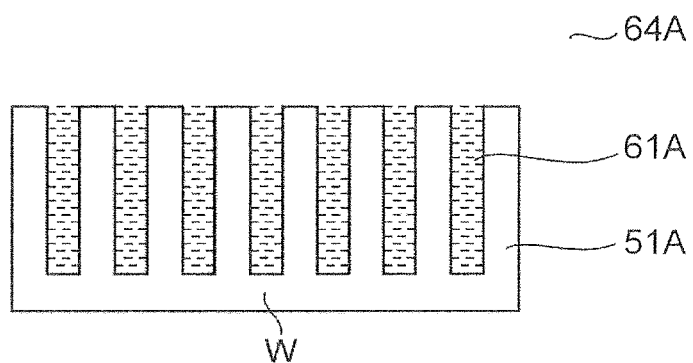
FIG. 26 is a second explanatory diagram illustrating the state of the wafer being processed.

In the temperature-pressure state of the internal atmosphere of the processing container 31A at the start of introduction of $CO_2$, as shown in FIG. 26, a high-pressure atmosphere of $CO_2$ 64A exists around the wafer W while the liquid IPA 61A exists in the recessed portions of the pattern 51A. The temperature and the pressure of the internal atmosphere of the processing container 31A are then raised along the curve shown by the solid line with arrows in FIG. 24 until the pressure reaches 6 MPa which is higher than the critical pressure of IPA and lower than the critical pressure of $CO_2$. In this embodiment, it is also possible to pressurize $CO_2$ to a pressure at which it turns into the supercritical or subcritical state (high-pressure state).

Figure 27:
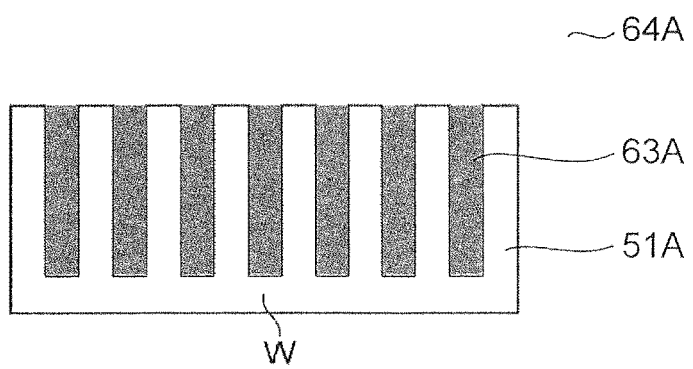
FIG. 27 is a third explanatory diagram illustrating the state of the wafer being processed.

By thus forming an atmosphere whose pressure is lower than the critical pressure of $CO_2$ and higher than the critical pressure of IPA, a high-pressure atmosphere, whose pressure is higher than the vapor pressure of IPA at the same temperature, is formed around the liquid IPA 61A being heated. Accordingly, the liquid IPA 61A on the surface of the wafer W maintains the liquid state (without boiling) while it is heated in the high-pressure atmosphere. When the internal temperature of the processing container 31A reaches the critical temperature of IPA, the liquid IPA 61A becomes supercritical IPA 63A while it is kept in the recessed portions of the pattern 51A (FIG. 27).

By thus raising the internal temperature of the processing container 30A while keeping the liquid IPA 61A in contact with the high-pressure gaseous $CO_2$ 64A, the liquid IPA 61A in the recessed portions can be directly changed into the supercritical IPA 63A. Furthermore, the use of $CO_2$ in a gaseous state as a pressurizing fluid can reduce the number of particles as compared to the use of $CO_2$ in a supercritical state (see FIG. 14).

Figure 28:
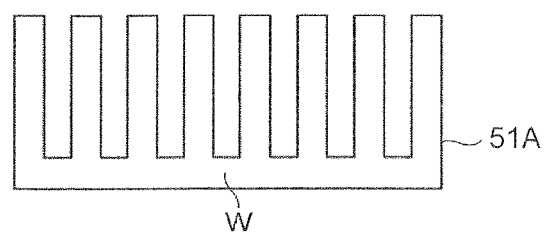
FIG. 28 is a fourth explanatory diagram illustrating the state of the wafer being processed.

After a sufficient time for the liquid IPA 61A in the pattern 51 of the wafer W to become the supercritical IPA 63A has elapsed since the start of the supply of the gaseous $CO_2$ 64A into the processing container 31A, the on-off valve 352A of the pressurized fluid supply line 351A is closed, while the pressure reducing valve 342A of the discharge line 341A is opened to discharge a fluid, in particular $CO_2$ gas and IPA in a supercritical state or a gaseous state, from the processing container 31A, whereby the wafer W in a dried state, from which the liquid IPA has been removed, can be obtained (FIG. 28).

As described above, the technique of adjusting the pressure in the processing container 31A by supplying a high-pressure fluid from the outside, and changing liquid IPA on a wafer W into the supercritical state and removing it from the wafer W while avoiding boiling of the liquid IPA, is not only applicable to the case of removing IPA that covers the surface of a wafer W. This technique may be applied to the case of removing IPA in which a wafer W, placed in the wafer tray 331A, is immersed as shown in FIG. 16.

Not only a high-pressure gas or a supercritical fluid, but a subcritical fluid of e.g. $N_2$ or $CO_2$ can also be used as a pressuring fluid to pressurize the internal atmosphere of the processing container 31A. Further, instead of the method of pressurizing the internal atmosphere of the processing container 31A by supplying a pressurizing fluid into the processing container 31A, it is possible to use a processing container 31A having a piston structure, and to pressurize the internal atmosphere of the processing container 31A by compressing an internal space in which a wafer W is housed.

An anti-drying liquid for use in the present invention is not limited to IPA. It is also possible to use other alcohols such as methanol and ethanol, various fluorine-containing solvents (fluorinated alcohol, hydrofluoroether, etc.), acetone, etc. Such an anti-drying liquid may be changed into the subcritical state when removing it from the surface of a wafer W. A wafer W covered with an anti-drying liquid may be carried into the processing container 31A after purging the processing container 31A with an inert gas, even when the anti-drying liquid is an incombustible one, e.g. for the purpose of preventing deterioration of the anti-drying liquid in a high-pressure state.

The processing container 31A of this embodiment is configured to heat the entire pressure-resistant container as shown in FIG. 15. The present invention, however, is not limited to the use of such a processing container. For example, it is possible to use a processing container having a nested structure, comprising an outer pressure-resistant container made of a material having a high pressure resistance and a relatively low thermal conductivity, such as stainless steel, carbon steel, titanium, Hastelloy (registered trademark), Inconel (registered trademark), or the like, and an inner container made of a material having a higher thermal conductivity than the outer pressure-resistant container, such as aluminum, copper, aluminum nitride, silicon carbide, or the like. A heat-insulating layer, e.g. made of quartz or alumina, may be provided between the inner and outer containers, and the processing container may be configured to heat only the inner container e.g. with the heater 322A. This can enhance the thermal responsiveness of the processing container and reduce energy consumption.

DESCRIPTION OF THE REFERENCE NUMERALS

W wafer; 1 cleaning system; 2 cleaning apparatus; 3 supercritical processing apparatus; 31, 31A processing container; 322, 322A heater; 341, 341A discharge line; 35, 35A pressurized fluid tank; 351, 351A pressurized fluid supply line; 4, 4A control section.

The invention claimed is:

1. A substrate processing method comprising the steps of:
   preheating an interior of a processing container by heating the processing container with a heating section to a temperature not less than the critical temperature of an anti-drying liquid;
   carrying a substrate via a transfer section into the interior of the processing container, the substrate comprising a three-dimensional pattern with recessed portions formed in a surface, said pattern being covered with the anti-drying liquid, the anti-drying liquid is one selected from a group consisting of isopropyl alcohol, methanol, ethanol, fluorine-containing solvents and acetone, that has entered the recessed portions of the pattern;
   heating the substrate in the processing container by keeping the temperature of the interior of the processing container heated by the heating section at not less than the critical temperature of the anti-drying liquid;
   supplying a pressurizing gas, the pressurizing gas is one of carbon dioxide and argon, into the processing container from a pressurized fluid supply line, so as to pressurize the interior atmosphere of the processing container before the anti-drying liquid vaporizes to such an extent to cause pattern collapse, wherein the pressurizing gas is pressurized and introduced into the processing container in a gaseous state to create a pressure not less than the critical pressure of the anti-drying liquid and not more than the critical pressure of the pressurizing gas in the processing container, such that the pressurizing gas in the gaseous state surrounds the anti-drying liquid in the recessed portions before the anti-drying liquid in the recessed portions becomes in a supercritical state,
   wherein the processing container is heated in a condition that the pressure of the pressurizing gas is kept at a pressure not more than the critical pressure of the pressurizing gas, and
   wherein the pressurizing gas is in the gaseous state when it is pressurized to a pressure not less than the critical pressure of the anti-drying liquid and when the anti-drying liquid becomes a supercritical state, the anti-drying liquid is removed from the recessed portions; and
   thereafter discharging from a discharge line the pressurizing gas and the anti-drying liquid from the processing container.

2. The substrate processing method according to claim 1, wherein the substrate is covered with the anti-drying liquid when the substrate is carried into the processing container.

3. The substrate processing method according to claim 1, wherein the method further comprises a step of supplying an inert gas into the processing container prior to the step of carrying the substrate into the processing container.

4. A substrate processing apparatus comprising:
   a processing container configured to perform removal of an anti-drying liquid from a substrate;
   a transfer section configured to carry the substrate into and out of the processing container;
   a heating section configured to heat the substrate that has been carried into the processing container by heating an interior of the processing container;
   a pressurized fluid supply line configured to supply a pressurizing gas into the processing container;
   a discharge line configured to discharge the pressurizing gas and the anti-drying liquid from the processing container; and
   a control section configured to output a control signal to control the transfer section, the heating section, the pressurized fluid supply line and the discharge line so that they perform a method comprising the steps of:
   preheating the interior of the processing container by heating the processing container with the heating section to a temperature not less than the critical temperature of the anti-drying liquid;
   carrying the substrate, the substrate comprising a three-dimensional pattern with recessed portions formed in a surface, said pattern being covered with the anti-drying liquid, the anti-drying liquid is one selected from a group consisting of isopropyl alcohol, methanol, ethanol, fluorine-containing solvents and acetone, that has entered the recessed portions of the pattern, via the transfer section into the interior of the processing container;
   heating the substrate in the processing container by keeping the temperature of the interior of the processing container heated by the heating section at not less than the critical temperature of the anti-drying liquid;
   supplying the pressurizing gas, the pressurizing gas is one of carbon dioxide and argon, into the processing container from the pressurized fluid supply line, so as to pressurize the interior atmosphere of the processing container before the anti-drying liquid vaporizes to such an extent to cause pattern collapse,
   wherein the pressurizing gas is pressurized and introduced into the processing container in a gaseous state to create a pressure not less than the critical pressure of the anti-drying liquid and not more than the critical pressure of the pressurizing gas in the processing container, such that the pressurizing gas in the gaseous state surrounds the anti-drying liquid in the recessed portions before the anti-drying liquid in the recessed portions becomes in a supercritical state,
   wherein the processing container is heated in a condition that the pressure of the pressurizing gas is kept at a pressure not more than the critical pressure of the pressurizing gas, and
   wherein the pressurizing gas in the gaseous state when it is pressurized to a pressure not less than the critical pressure of the anti-drying liquid and when the anti-drying liquid becomes a supercritical state, the anti-drying liquid is removed from the recessed portions; and
   thereafter discharging from the discharge line the pressurizing gas and the anti-drying liquid from the processing container.

5. The substrate processing apparatus according to claim 4, wherein the substrate is covered with the anti-drying liquid when the substrate is carried into the processing container.

6. The substrate processing apparatus according to claim 4, wherein an inert gas is supplied into the processing container prior to the substrate being carried into the processing container.

7. A non-transitory storage medium storing a computer program configured such that, upon execution of which by a control section for controlling a substrate processing apparatus, the control section controls the substrate processing apparatus to perform the substrate processing method according to claim 1.

* * * * *